(12) United States Patent
Gorokhovsky

(10) Patent No.: US 8,658,010 B2
(45) Date of Patent: **\*Feb. 25, 2014**

(54) FILTERED CATHODIC ARC DEPOSITION METHOD AND APPARATUS

(75) Inventor: Vladimir Gorokhovsky, San Antonio, TX (US)

(73) Assignee: G & H Technologies, LLC, Missoula, MT (US)

( * ) Notice: Subject to any disclaimer, the term of this patent is extended or adjusted under 35 U.S.C. 154(b) by 639 days.

This patent is subject to a terminal disclaimer.

(21) Appl. No.: 12/695,818

(22) Filed: Jan. 28, 2010

(65) Prior Publication Data

US 2010/0170787 A1    Jul. 8, 2010

Related U.S. Application Data

(63) Continuation of application No. 11/890,736, filed on Aug. 6, 2007, now abandoned, which is a continuation of application No. 10/713,529, filed on Nov. 13, 2003, now Pat. No. 7,252,745, which is a continuation of application No. 09/826,940, filed on Apr. 6, 2001, now Pat. No. 6,663,755.

(51) Int. Cl.
*C23C 14/34* (2006.01)

(52) U.S. Cl.
USPC ................... 204/298.41; 204/192.38

(58) Field of Classification Search
USPC .......................... 204/192.38, 298.41
See application file for complete search history.

(56) References Cited

U.S. PATENT DOCUMENTS

| | | |
|---|---|---|
| 3,793,179 A | 2/1974 | Sablev |
| 4,448,659 A | 5/1984 | Morrison |
| 4,448,802 A | 5/1984 | Buhl et al. |
| 4,492,845 A | 1/1985 | Kljuchko et al. |
| 4,673,477 A | 6/1987 | Ramalingam |
| 4,724,058 A | 2/1988 | Morrison, Jr. |

(Continued)

FOREIGN PATENT DOCUMENTS

| | | |
|---|---|---|
| DE | 4223592 A1 | 1/1994 |
| DE | 19739527 A1 | 3/1999 |
| EP | 0495447 A1 | 7/1992 |
| EP | o511153 A1 | 10/1992 |

*Primary Examiner* — Rodney McDonald
(74) *Attorney, Agent, or Firm* — Jean Kyle

(57) ABSTRACT

An apparatus for the application of coatings in a vacuum comprising a plasma duct surrounded by a magnetic deflecting system communicating with a first plasma source and a coating chamber in which a substrate holder is arranged off of an optical axis of the plasma source, has at least one deflecting electrode mounted on one or more walls of the plasma duct. In one embodiment an isolated repelling or repelling electrode is positioned in the plasma duct downstream of the deflecting electrode where the tangential component of a deflecting magnetic field is strongest, connected to the positive pole of a current source which allows the isolated electrode current to be varied independently and increased above the level of the anode current. The deflecting electrode may serve as a getter pump to improve pumping efficiency and divert metal ions from the plasma flow. In a further embodiment a second arc source is activated to coat the substrates while a first arc source is activated, and the magnetic deflecting system for the first arc source is deactivated to confine plasma to the cathode chamber but permit electrons to flow into the coating chamber for plasma immersed treatment of the substrates. A load lock shutter may be provided between the plasma duct and the coating chamber further confine the plasma from the first arc source.

7 Claims, 22 Drawing Sheets

(56) References Cited

U.S. PATENT DOCUMENTS

| | | |
|---|---|---|
| 5,279,723 A | 1/1994 | Falabella et al. |
| 5,298,136 A | 3/1994 | Ramalingam |
| 5,317,235 A | 5/1994 | Treglio |
| 5,380,421 A | 1/1995 | Gorokhovsky |
| 5,387,326 A | 2/1995 | Buhl et al. |
| 5,433,836 A | 7/1995 | Martin et al. |
| 5,435,900 A | 7/1995 | Gorokhovsky |
| 5,468,363 A | 11/1995 | Falabella |
| 5,478,608 A | 12/1995 | Gorokhovsky |
| 5,480,527 A | 1/1996 | Welty |
| 5,503,725 A | 4/1996 | Sablev et al. |
| 5,580,429 A | 12/1996 | Chan et al. |
| 5,587,207 A | 12/1996 | Gorokhovsky |
| 5,799,549 A | 9/1998 | Decker et al. |
| 5,840,163 A | 11/1998 | Welty |
| 6,602,390 B1 | 8/2003 | Brandle |
| 6,617,057 B2 | 9/2003 | Gorokhovsky |
| 6,663,755 B2 * | 12/2003 | Gorokhovsky .......... 204/298.41 |
| 6,684,759 B1 | 2/2004 | Gorokhovsky |
| 7,252,745 B2 * | 8/2007 | Gorokhovsky .......... 204/192.38 |
| 7,300,559 B2 * | 11/2007 | Gorokhovsky .......... 204/192.38 |

* cited by examiner

FILTERED CATHODIC ARC DEPOSITION METHOD AND APPARATUS

CROSS-REFERENCE TO RELATED APPLICATIONS

The present application claims the benefits under all relevant U.S. statutes, including 35 U.S.C. 120, and is a continuation of application Ser. No. 11/890,736, filed Aug. 6, 2007 now abandoned, titled FILTERED CATHODIC ARC DEPOSITION METHOD AND APPARATUS, now abandoned, which is a continuation of application Ser. No. 10/713,529, filed Nov. 13, 2003, now U.S. Pat. No. 7,252,745 B1, which is a continuation of application Ser. No. 09/826,940, filed Apr. 6, 2001, now U.S. Pat. No. 6,663,755, which in turn claims priority under 35 U.S.C. 119 to Canadian Application No. 2,305,938, filed Apr. 10, 2000.

STATEMENT REGARDING FEDERALLY SPONSORED RESEARCH OR DEVELOPMENT

Not applicable

REFERENCE TO SEQUENCE LISTING, A TABLE, OR A COMPUTER PROGRAM COMPACT DISC APPENDIX

Not Applicable

FIELD OF THE INVENTION

This invention relates to the application of coatings in a vacuum apparatus. In particular, this invention relates to an apparatus which generates a plasma of electrically conducting materials for the application of coatings to surfaces of a substrate by way of condensation of plasma. The apparatus can be used in mechanical engineering, instrument and tool making, in the production of electronic equipment, and in other fields of industry.

BACKGROUND OF THE INVENTION

Many types of vacuum arc coating apparatus utilize a cathodic arc source, in which an electric arc is formed between an anode and a cathode plate in a vacuum chamber. The arc generates a cathode spot on a target surface of the cathode, which evaporates the cathode material into the chamber. The cathodic evaporate disperses as a plasma within the chamber, and upon contact with the exposed surfaces of one or more substrates coats the substrates with the cathode material, which may be metal, ceramic, etc. An example of such an arc coating apparatus is described in U.S. Pat. No. 3,793,179 issued Feb. 19, 1974 to Sablev, which is incorporated herein by reference.

An undesirable result of the vacuum arc coating technique is the creation of macroparticles, which are formed from molten cathode material vaporized by the arc. These macroparticles are ejected from the surface of the cathode material, and can contaminate the coating as it is deposited on the substrate. The resulting coating may be pitted or irregular, which at best presents an aesthetic disadvantage, but is particularly problematic in the case of coatings on precision instruments.

In order to reduce the incidence of macroparticles contacting the substrate, conventionally a vacuum arc coating apparatus may be constructed with a filtering mechanism that uses electromagnetic fields which direct or deflect the plasma stream. Because macroparticles are neutral, they are not influenced by these electromagnetic fields. Such an apparatus can therefore provide a plasma duct between the cathode chamber and a coating chamber, wherein the substrate holder is installed off of the optical axis of the plasma source. Focusing and deflecting electromagnets around the apparatus thus direct the plasma stream towards the substrate, while the macroparticles, uninfluenced by the electromagnets, would continue to travel in a straight line from the cathode. An example of such an apparatus is described and illustrated in U.S. Pat. No. 5,435,900 issued Jul. 25, 1995 to Gorokhovsky for an "Apparatus for Application of Coatings in Vacuum", which is incorporated herein by reference.

Another such apparatus is described in the article "Properties of Tetrahedral Amorphous Carbon Prepared by Vacuum Arc Deposition", *Diamond and Related Materials* published in the United States by D. R. McKenzie in 1991 (pages 51 through 59). This apparatus consists of a plasma duct made as a quarter section of a tore surrounded by a magnetic system that directs the plasma stream. The plasma duct communicates with two chambers, one chamber which accommodates a plasma source and a coating chamber which accommodates a substrate holder.

The configuration of this apparatus limits the dimensions of the substrate to be coated to 200 mm, which significantly limits the range of its application. Furthermore, there is no provision in the tore-shaped plasma duct for changing the configuration of the magnetic field, other than the magnetic field intensity. Empirically, in such an apparatus the maximum value of the ionic current at the exit of the plasma duct cannot exceed 1 percent of the arc current. This is related to the turbulence of the plasma stream in the tore, which causes a drastic rise in the diffusion losses of ions on the tore walls.

The apparatus taught by Gorokhovsky in U.S. Pat. No. 5,435,900 incorporates a plasma duct surrounded by the deflecting magnetic system, a plasma source and a substrate holder mounted in the coating chamber off of the optical axis of the plasma source, where the plasma source and the substrate holder are surrounded by the focusing electromagnets. The plasma duct is designed in the form of a parallelepiped with the substrate holder and the plasma source mounted on adjacent planes. The magnetic system that forces the plasma stream towards the substrate consists of linear conductors arranged along the edges of the parallelepiped. The plasma duct has plates with diaphragm filters connected to the positive pole of the current source and mounted on one or more planes (not occupied by the plasma source) of the plasma duct. These plates serve as deflecting electrodes to establish an electric field in a transversal direction relative to the magnetic field lines, to guide plasma flow toward the substrate to be coated.

The advantages provided by U.S. Pat. No. 5,435,900 to Gorokhovsky include increasing the range of dimensions of articles (substrates) which can be coated, and providing the user with the option of changing the configuration of the magnetic field in order to increase ionic current at the exit of the plasma duct to 2 to 3 percent of the arc current.

A deflecting electrode is also described in U.S. Pat. No. 5,840,163 issued Nov. 24, 1998 to Welty, which is incorporated herein by reference. This patent teaches a rectangular vacuum arc plasma source and associated apparatus in which a deflecting electrode is mounted inside the plasma duct and either electrically floating or biased positively with respect to the anode. However, this device requires a sensor, which switches the polarity of the magnetic field when the arc spot on the rectangular source has reached the end of the cathode, in order to move the arc spot to the other side of the cathode.

This results in an undesirable period where the magnetic field is zero; the arc is therefore not continuous, and is not controlled during this period. This 'pseudo-random' steering method cannot consistently produce reliable or reproducible coatings.

If the potential of the deflecting electrode ($V_d$) located opposite the plasma source is greater than the potential of the plasma source wall ($V_w$), an electric field occurs between them. The intensity of the electric field is given by:

$$E \propto \frac{V_d - V_w}{d} \propto \sigma[1 + (\omega_e \tau_e)^2] I_d \quad (1)$$

where
d is the distance between the plate and the plasma duct wall,
$\omega_e$ is the gyro frequency of magnetized plasma electrons,
$\tau_e$ is the characteristic time between electron collisions,
$\sigma$ is the specific resistivity of the plasma in the absence of a magnetic field, and
$I_d$ is the current of the deflecting electrode.

Because $\omega_e$ is proportional to the plasma-guiding magnetic field B, (i.e. $\omega_e \propto B$), the transversal electric field $E_t$ as determined by formula (1) will be proportional to $B^2$, as shown by the following equation:

$$E_t \propto \sigma[1+(\omega_e \tau_e)^2] I_d \propto B_t^2 I_d \quad (2)$$

where $B_t$ is the component of the magnetic field which is tangential to the surface of the deflecting electrode.

An ion is influenced by the force:

$$F_i = Q_i \times E_i \quad (3)$$

where $Q_1$ is the ion charge. Combining formulae (2) and (3) yields:

$$F_i \propto Q_i B_t^2 I_d \quad (4)$$

This force causes the ion to turn away from the wall opposite the plasma source and directs it towards the substrate to be coated.

In the prior art, most of the surface of the deflecting electrode is disposed in a position where the transversal component of the magnetic field is strong and the tangential component of the magnetic field is relatively weak, which results in low magnetic insulation along the deflecting electrode. This is a disadvantage of the systems taught by Gorokhovsky and Welty, as it results in a weak deflecting electric field which is not strong enough to change the trajectory of heavy metal ions, such as $Gf^+$ and $W^+$, toward the substrate to be coated. Even in the case lighter ions such as $Al^+$ and $Ti^+$ the degree of ion deflection is slight, which results in substantial losses of metal ions before the plasma reaches the position of the substrate(s).

Another method used to reduce the incidence of macroparticles reaching the substrate is a mechanical filter consisting of a baffle, or set of baffles, interposed between the plasma source and the plasma duct and/or between the plasma duct and the substrate. Filters taught by the prior art consist of simple stationary baffles of fixed dimension, such as is described in U.S. Pat. No. 5,279,723 issued Jan. 18, 1994 to Falabella et al., which is incorporated herein by reference. Such filters create large plasma losses and a very low plasma yield, because the baffles destroy the geometry of the plasma duct.

Other mechanical filtering mechanisms, such as that taught by U.S. Pat. No. 5,435,900 to Gorokhovsky, trap macroparticles by altering the path of the plasma stream off of the optical axis of the plasma source toward the substrate, and trapping macroparticles in a baffle disposed generally along the optical axis of the cathode. However, this solution affects macroparticles only and does not allow for control of the plasma composition in the coating chamber, for example where it would be desirable to expose the substrate(s) to an ionized plasma without a metal component, as in plasma immersed processes such as ion implantation, ion cleaning, ion nitriding and the like. As such, prior art vacuum coating apparatus is suitable for use only in plasma vapor deposition (PVD) processes and a separate apparatus is required for plasma immersed processes.

BRIEF SUMMARY OF THE INVENTION

The invention overcomes these disadvantages by providing mechanisms for the effective deflection of the plasma flow, and for controlling the composition of the plasma to allow the apparatus to be used for arc processes other than PVD coating.

In one embodiment the invention provides a coating chamber disposed off of the optical axis of a filtered arc source containing a cathode, wherein an isolated repelling electrode is positioned in the plasma duct, separate from the deflecting electrode, such that the deflecting magnetic field is substantially tangential to a substantial portion of the surface of the repelling electrode. The current applied to the isolated repelling electrode can be varied independently of the current applied to the deflecting electrode, thus allowing the electric field about the repelling electrode to be enhanced and facilitating the function of sustaining the arc in the plasma duct, without altering the deflecting properties of the deflecting electrode.

In a further embodiment the repelling electrode is disposed within the plasma duct in the path of the plasma stream, the placement and orientation of the repelling electrode thereby creating an electric field which divides the electric current, physically dividing the plasma stream, which merges after passing around the repelling electrode. The invention thus reduces the loss of metal ions at the substrate in a vacuum arc coating apparatus, and improves the quality of the vacuum within the apparatus. The dividing electrode, being electrically isolated and independently energized, further serves as an auxiliary anode for sustaining the arc in the plasma duct. This embodiment of the invention is particularly advantageously implemented in a vacuum arc coating apparatus in which two plasma sources disposed on opposite sides of a common plasma duct each generate a plasma stream which combine at the entrance to the plasma duct and flow into the coating chamber.

The repelling electrode and/or the deflecting electrode can be maintained at floating potential, or can be connected to the positive poles of separate power sources so that the applied current can be varied independently of one another.

In a further embodiment the deflecting electrode is surrounded by a baffle for removing macroparticles from the plasma stream, which also serves as a getter pump to remove gaseous contaminants from within the apparatus. When the baffle is maintained at floating or negative potential, ions are adsorbed to the surface of the baffle.

The invention also provides a multiple-cathode apparatus suitable for use in plasma-immersed processes as ion implantation, ion nitriding, ion cleaning and the like. In these embodiments a first filtered arc source containing one or more cathodes generates cathodic evaporate for coating the substrate, while the deflecting and focusing magnetic fields affecting a second filtered arc source are deactivated so that cathodic evaporate does not flow toward the substrates. The second filtered arc source thus functions as a powerful electron emitter for plasma immersed treatment of the substrates.

Optionally in these embodiments a load lock shutter comprising a metallic grid is disposed between the plasma duct and the coating chamber, to control communication between the plasma source and the coating chamber. Where particularly contaminant-free conditions are required the load lock shutter can be closed to contain macroparticles and metal vapour within the cathode chamber(s) and plasma duct, but permit the passage of electrons into the coating chamber to thus increase the ionization level of a gaseous component within the coating chamber. The load lock shutter can be charged with a negative potential, to thus serve as an electron accelerator and ion extractor. Optionally load lock shutters may also be provided between the filtered arc source and the plasma duct, and/or between the cathodes and the deflecting electrode within a filtered arc source.

The load lock shutters can also be used in conjunction with the deflecting electrode operating as a getter pump, to improve the quality of the vacuum in the chamber.

The present invention thus provides an apparatus for the application of coatings in a vacuum, comprising at least one filtered arc source comprising at least one cathode contained within a cathode chamber, at least one anode associated with the cathode for generating an arc discharge, a plasma duct in communication with the cathode chamber and with a coating chamber containing a substrate holder for mounting substrates to be coated, the substrate holder being positioned off of an optical axis of the cathode, at least one deflecting electrode electrically insulated from the plasma duct and disposed adjacent to one or more walls of the plasma duct that are not occupied by the cathode, at least one deflecting conductor disposed adjacent to the plasma source and the plasma duct, and at least one repelling electrode connected to the positive pole of a current source and disposed along the plasma duct at a position between the deflecting electrode and the coating chamber.

In an embodiment in which a pair of cathodes are disposed in a filtered arc source on opposite sides of the plasma guide, at least a portion of the deflecting electrode and the repelling electrode are disposed in alignment with a plane of symmetry between opposite walls of the plasma guide. The plane of symmetry extends between magnetic cusps generated by deflecting conductors disposed adjacent to the plasma duct at the intersection with the filtered arc source, and the repelling electrode can thus be positioned between the cusps in a portion of the plasma duct in which a tangential component of the deflecting magnetic fields is strongest.

In a further aspect of the invention the apparatus comprises at least one focusing conductor positioned adjacent to the plasma duct between the deflecting conductor and the coating chamber for generating a focusing magnetic field which focuses plasma entering the coating chamber.

In a further aspect of the invention the repelling electrode is disposed near a position where a tangential component of a magnetic field within the plasma duct is strongest.

The present invention further provides an apparatus for the application of coating in a vacuum, comprising a plurality of substantially opposed cathode chamber pairs, each cathode chamber containing a cathodic arc source and being disposed along a plasma duct in communication with each of the cathode chambers and in communication with a coating chamber containing a substrate holder for mounting substrates to be coated, the substrate holder being positioned off of an optical axis of the cathodic arc sources at least one anode associated with each cathodic arc source for generating an arc discharge, a deflecting system for deflecting a flow of plasma through the plasma duct toward the substrate chamber, and a plurality of magnetic isolating coils each disposed about the plasma duct between cathode chamber pairs, transversely relative to the plasma duct and relative to a direction of the cathodic arc flow through the plasma duct, wherein when an isolating coil is activated a flow of plasma is confined by the isolating coil.

The present invention further provides a method of coating an article in an coating apparatus comprising a plurality of substantially opposed cathode chambers each supporting a cathodic arc source and being disposed along an elongated plasma duct in communication with the cathode chambers, at least one anode associated with each cathodic arc source, a plurality of magnetic isolating coils each disposed transversely relative to the plasma duct between cathode chamber pairs, and a coating chamber in communication with an end of the plasma duct, the method comprising the steps of: a) generating an arch between the cathodic arc source and its associated anode to create a plasma of cathodic evaporate, and b) selectively activation the isolating coils to confine the plasma within a cell formed between isolating coils for a selected material.

In a further embodiment the isolating coils and the cathodic arc sources are energized sequentially, to raster the plasma jets along the plasma duct. When the impulse cathodic arc sources are energized plasma jets are generated along magnetic field lines created by the deflecting magnetic system and a rastering system comprising the isolating coils. These magnetic coils combine to create a magnetic field which guides the plasma jets toward the coating chamber. By rastering the magnetic fields in conjunction with impulsing the cathodic arc sources, each impulse provide a portion of metal plasma to a different location along the substrates.

The present invention further provides an apparatus for the application of coatings in a vacuum, comprising at least one plasma source comprising a cathode contained within a cathode chamber, at least one proximal anode associated with the cathode for generating an arch discharge, a plasma duct in communication with the cathode chamber and with a coating chamber containing a substrate holder for mounting substrates to be coated, the substrate holder being positioned off of an optical axis of the cathode, and at least one auxiliary anode disposed downstream of the plasma source for generating an auxiliary arc discharge.

The present invention further provides an apparatus for the application of coatings in a plasma-immersed environment, comprising a first plasma source comprising a first cathode contained within a cathode chamber and associated with an anode for generating an arc discharge between the anode and the first cathode, a plasma duct in communication with the cathode chamber and with a coating chamber containing a substrate holder for mounting substrates to be coated, the substrate holder being positioned off of an optical axis of the first cathode, a second plasma source comprising a second cathode in communication with the coating chamber and associated with an anode for generating an arc discharge between the anode and the second cathode, a deflecting system for directing a flow of plasma to the coating chamber, wherein the deflecting system can be deactivated while the first plasma source is activated so that plasma from the first cathode does not flow into the coating chamber but electrons emitted from the first cathode flow into the coating chamber.

The present invention further provides a method of coating a substrate in a plasma-immersed environment, comprising the steps of a). activating a first plasma source comprising a first cathode contained within a first cathode chamber in communication with a coating chamber containing a substrate holder, the substrate holder being positioned off of an optical axis of the first cathode, b). activating a second plasma source comprising a second cathode contained within a second cathode chamber in communication with coating chamber, at a position remote from the first cathode chamber, and c). selectively deactivating a deflecting system that directs plasma from the first cathode into the coating chamber and establishing an auxiliary arc discharge between the first cathode and an anode contained within the coating chamber, so that ions emitted form the first cathode are substantially prevented from flowing into the coating chamber.

The present invention further provides an apparatus for the application of coatings in a vacuum, comprising at least one filtered arc source comprising at least one cathode contained within a cathode chamber, at least one anode associated with the cathode for generating an arc discharge, at least one auxiliary anode disposed downstream of the plasma source for generating an auxiliary arc discharge a plasma duct in communication with the cathode chamber and with a coating chamber containing a substrate holder for mounting substrates to be coated, the substrate holder being positioned off of an optical axis of the cathode, at least one deflecting electrode electrically insulated from the plasma duct and disposed adjacent to one or more walls of the plasma duct that are not occupied by the cathode, at least one deflecting conductor disposed adjacent to the plasma source and the plamsa duct, and at least one metal vapour plasma source disposed opposite to substrate holder, comprising crucible containing material to be evaporated, the crucible being shielded from a surrounding plasma environment.

BRIEF DESCRIPTION OF THE SEVERAL VIEWS OF THE DRAWING

In drawings which illustrate by way of example only preferred embodiments of the invention.

DETAILED DESCRIPTION OF THE INVENTION

Figure 1:
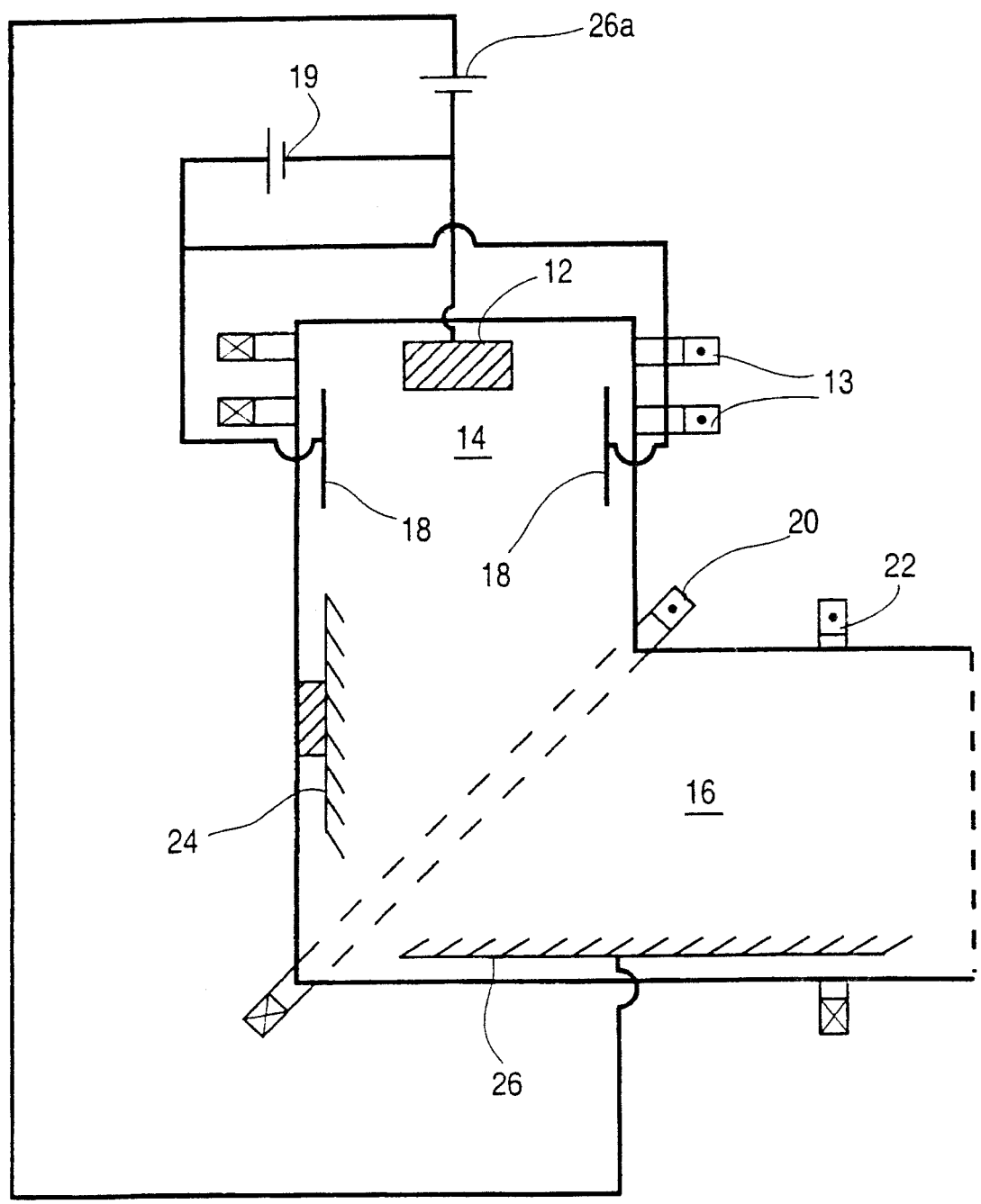
FIG. 1 is a schematic plan view of a prior art vacuum arc coating apparatus.

FIG. 1 illustrates a prior art apparatus for the application of coatings in a vacuum. The apparatus comprises a plasma source comprising cathode 12 disposed in a cathode chamber 14 in communication with a plasma duct 16 in the form of a parallelepiped. Cathode 12 is surrounded by focusing and stabilizing electromagnets 13, and anodes 18 are disposed on planes of the cathode chamber 14 adjacent to the cathode 12 to create an electric arc discharge when current source 19 is activated.

A deflecting magnetic system comprises a rectangular coil 20 formed from linear conductors surrounding the plasma duct 16. A focusing coil 21 may also be provided surrounding the plasma duct 16. The plasma duct 16 is in communication with a coating chamber (not shown), in which a substrate holder (not shown) supporting the substrates (not shown) is positioned. The substrate holder is thus located off of the optical axis of the cathode 12, preferably at approximately a right angle, to minimize the flow of neutral particles toward the substrates.

On the walls of plasma duct 16 are mounted plate electrodes 24, 26 provided with diaphragm filters, spaced from the walls of the plasma duct 16 and electrically insulated therefrom, for deflecting the flow of plasma away from the optical axis of the cathode 12 and through the plasma duct 16. In the embodiment shown deflecting electrode 26 is located on a parallelepiped wall opposite the cathode 12. Deflecting electrode 26 may optionally be located on any wall adjoining the wall on which the cathode 12 is positioned. In these positions, electrode 26 serves both as a baffle which traps macroparticles and as a deflecting element which redirects the plasma stream toward the substrates.

Deflecting electrode 26 is shown spaced from the wall of the plasma duct 16, which permits a flow of plasma behind the electrode 26. The deflecting electrode 26 may be at floating potential, or is optionally positively biased by connecting it to the positive pole of an auxiliary current source 26a as shown. Deflecting electrode 24 is shown at a floating potential.

In the prior art apparatus of FIG. 1 a substantial part of the surface of deflecting electrode 26 is disposed outside of the cusp of the magnetic field generated by deflecting coil 20, i.e. in the deflection region of the plasma duct 16, where the tangential component of the magnetic field generated by the deflecting coil 20 is relatively small. Although the magnetic field does not influence ions directly, a strong tangential magnetic field confines electron clouds which creates an electric field that repels ions. Thus, in the deflecting region the electric field generated by deflecting electrode 26 has little influence on ions entrained in the plasma stream, and ions tend to accumulate on the electrode 26 because the residual component of their momentum along the optical axis of the cathode 12 exceeds the deflecting force of the deflecting field generated by deflecting electrode 26.

Figure 2:
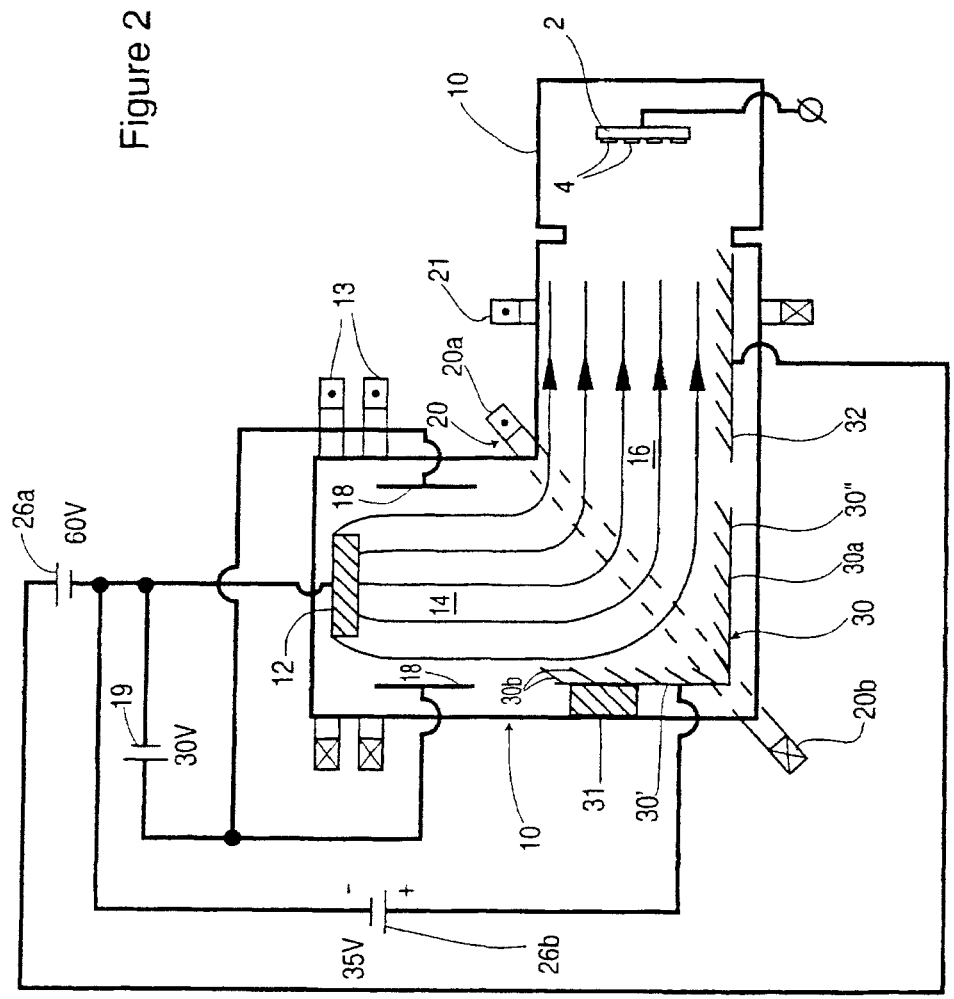
FIG. 2 is a schematic plan view of a single source vacuum arc coating apparatus embodying the invention.

FIG. 2 illustrates a first preferred embodiment of the present invention utilizing a filtered arc source containing a single cathode 12 disposed in a cathode chamber 14 in communication with a plasma duct 16. The cathode chamber 14 is surrounded by focusing and stabilizing electromagnets 13, and anodes 18 are disposed on planes of the cathode chamber 14 adjacent to the cathode 12a and connected to DC power source 19, as in the prior art apparatus.

The deflecting magnetic system comprises rectangular coil 20 surrounding the plasma duct 16, and a focusing coil 21 is provided surrounding the plasma duct 16 downstream of the deflecting coil 20. As in the prior art the plasma duct 16 is in communication with a substrate chamber 10 containing the substrate holder 2, positioned off of the optical axis of the cathode 12.

According to the invention the apparatus is provided with at least one deflecting electrode 30 and at least one repelling electrode 32.

The deflecting electrode 30 is insulated from the wall of the plasma duct 16 as by insulating spacer 31 and preferably comprises a generally planar conductive plate 30a, optionally with diaphragm filters 30b located on the optically exposed surfaces of the plate 30a and disposed obliquely relative thereto. In the embodiment shown the deflecting electrode 30 can be considered to consist of either two separate electrode sections 30', 30" which are electrically connected together at the corner of the plasma duct 16, or as a single deflecting electrode 30 with orthogonal sections 30', 30" configured to generally conform to the interior surface of the adjoining walls of the plasma duct 16. The deflecting electrode 30 is preferably spaced from the walls of the plasma duct 16 to minimize obstruction to the flow of plasma through the plasma duct 16, and may be maintained at a floating potential, or optionally positively biased by connection to an auxiliary power source 26b as shown. It is also possible to use the primary current source 19 both to generate an arc current between the cathode 12 and anodes 18 and to bias the deflecting electrode 30.

Most of the deflecting electrode 30 is positioned in the deflecting portion of the plasma duct 16, in which the tangential component of the magnetic field generated by the deflecting coil 20 is relatively small. This significantly reduces the effectiveness of the deflecting electrode 30. The deflecting influence of the deflecting electrode 30 can be enhanced by increasing the current applied to the electrode 30, but increasing the current also increases the incidence of arc spot generation and erosion of the cathode 12, which would result in a much higher macroparticle density with little corresponding increase in ion yield at the substrate. Moreover, this commensurately increases the risk of short-circuiting the arc current.

Thus, according to the invention a separate repelling electrode 32, electrically isolated from the deflecting electrode 30, is positioned downstream of the deflecting electrode 30 where the transversal component of the magnetic field generated by the deflecting magnetic coil 20 is weakest and the tangential component of the magnetic field is strongest. The repelling electrode 32 is electrically isolated from the deflecting electrode, which facilitates independent control of the bias potential on the repelling electrode 32. In the embodiment shown repelling electrode 30 is biased through connection to an auxiliary DC current source 26a.

In operation, the substrates 4 are mounted on the substrate holder 2 in the coating chamber 10. The apparatus is evacuated to the desired pressure using conventional techniques and vacuum pumping apparatus well known to those skilled in the art. The primary current source 19 is activated, creating an arc discharge between the cathode 12 and anodes 18 which begins to evaporate the cathodic material into the cathode chamber 14. At the same time, or after a selected time interval as desired, the auxiliary current source 26a is energized to bias the repelling electrode 32, creating an electric field of relatively uniform intensity along the wall of the plasma duct 16 opposite the cathode chamber 14.

Cathodic evaporate is ejected from cathode 12 in an ionized plasma containing both ionized coating particles and neutral contaminate or macroparticles. The plasma is focused by the magnetic focusing coils 13 and flows past the anodes 18, as is conventional. The plasma stream, with entrained macroparticles vaporized from the evaporation surface of the cathode 12, is thus ejected toward the deflecting electrode 30. The magnetic deflecting coil 20 generates a magnetic field which directs the plasma stream and ions of coating material suspended therein through the plasma duct 16 toward the coating chamber 10, as shown by the arrows in FIG. 2. Neutral macroparticles remain unaffected by the deflecting magnetic field and the electric fields generated around deflecting electrode 30 and repelling electrode 32, and continue in a path generally along the optical axis of the cathode 12, striking the deflecting electrode 30 and either adhering to the electrode 30 or falling to the bottom of the apparatus.

The primary cathodic arc source installed in cathode chamber 14 can be similar to the plasma source described in U.S. Pat. No. 3,793,179 issued Feb. 19, 1974 to Sablev, which is incorporated herein by reference. This plasma source utilizes a circular cylinder target. To cover a large area coating zone several cathodic arc sources with cylindrical targets can be installed on the side wall of the cathode chamber 14. The primary cathodic arc source can be of rectangular design, as was described in U.S. Pat. No. 5,380,421 issued Jan. 10, 1995 to V. Gorokhovsky or in International Patent Application No. PCT/CA00/00380, which are incorporated herein by reference. In this case the cathode target is rectangular covering entire coating zone.

It will be appreciated that because the plasma cannot traverse the deflecting magnetic field lines, in order to fully utilize the cathode target the magnetic cusp generated by the deflecting conductor 20a must be oriented toward the coating chamber 42, to guide the plasma stream toward the coating chamber 42. An opposite cusp, which would lead the plasma stream in a direction opposite the coating chamber, is created by the closing conductors 20b of the deflecting coils 20, as shown in FIG. 3b; thus, the closing conductors 20b are maintained remote from the filtered arc source, and the cathodes 12 must be positioned within the cusp of the magnetic field generated by the deflecting conductor 20a of the deflecting coil 20. Any portion of the plasma outside of the cusp of the deflecting magnetic field will be deflected into the back wall (behind the deflecting electrode portion 30') of the cathode chamber 14, and will not reach the substrates 4.

The use of linear deflecting and focusing conductors 20a, 21 allows the plasma duct to be of virtually unlimited length. The linear conductors 20a, 21 each generate a cusp of magnetic field lines which curves in two-dimensions, along the direction of plasma flow, but has a height which is limited only by the length of the linear conductors 20a and 21, which allows for the coating of substrates 4 of considerably larger dimensions as described in U.S. Pat. No. 5,435,900 to Gorokhovsky, which is incorporated herein by reference. The deflecting and focusing magnetic fields are thus quasi-two dimensional, in that the cross-section of the cusp (for example as reflected by the plasma flow lines in FIG. 2) is substantially constant in the third dimension.

To increase the proportion of ions which reach the substrates, the repelling electrode 32 is preferably biased to a higher positive potential than the deflecting electrode 30. Thus, although the tangential component of the deflecting magnetic field generated by the deflecting magnetic coil 20 is weak in the deflecting region containing the deflecting electrode 30, this can now be compensated for by increasing the potential applied to, and thus the deflecting effect of, the repelling electrode 32, without risking short circuiting the arc current or misdirecting the plasma flow. This is made possible because the repelling electrode 32 is disposed in a portion of the plasma duct where the tangential magnetic field component is strong.

Figure 3A:
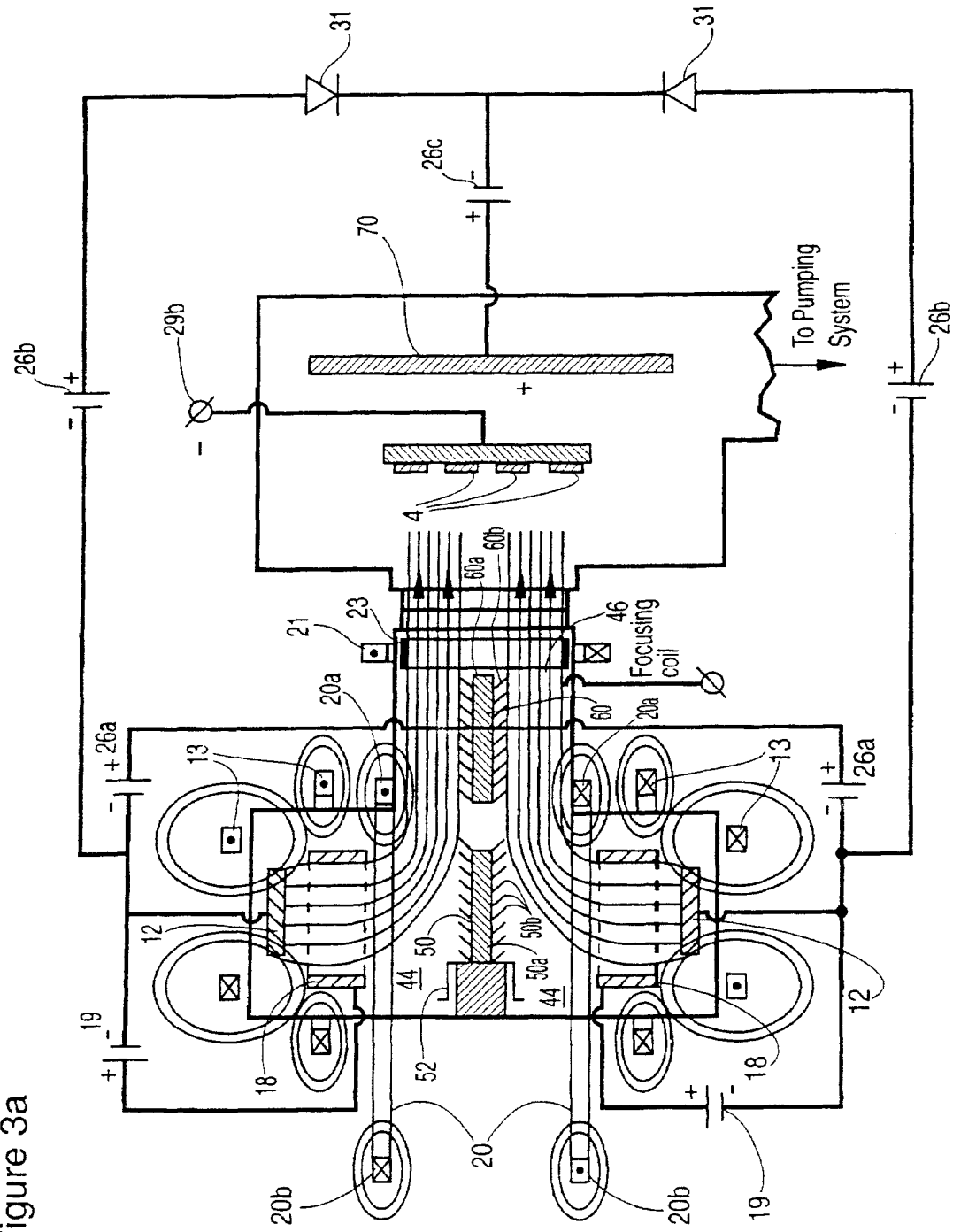
FIG. 3a is a schematic plan view of a dual-cathode filtered arc source vacuum arc coating apparatus embodying the invention.
Figure 3B:
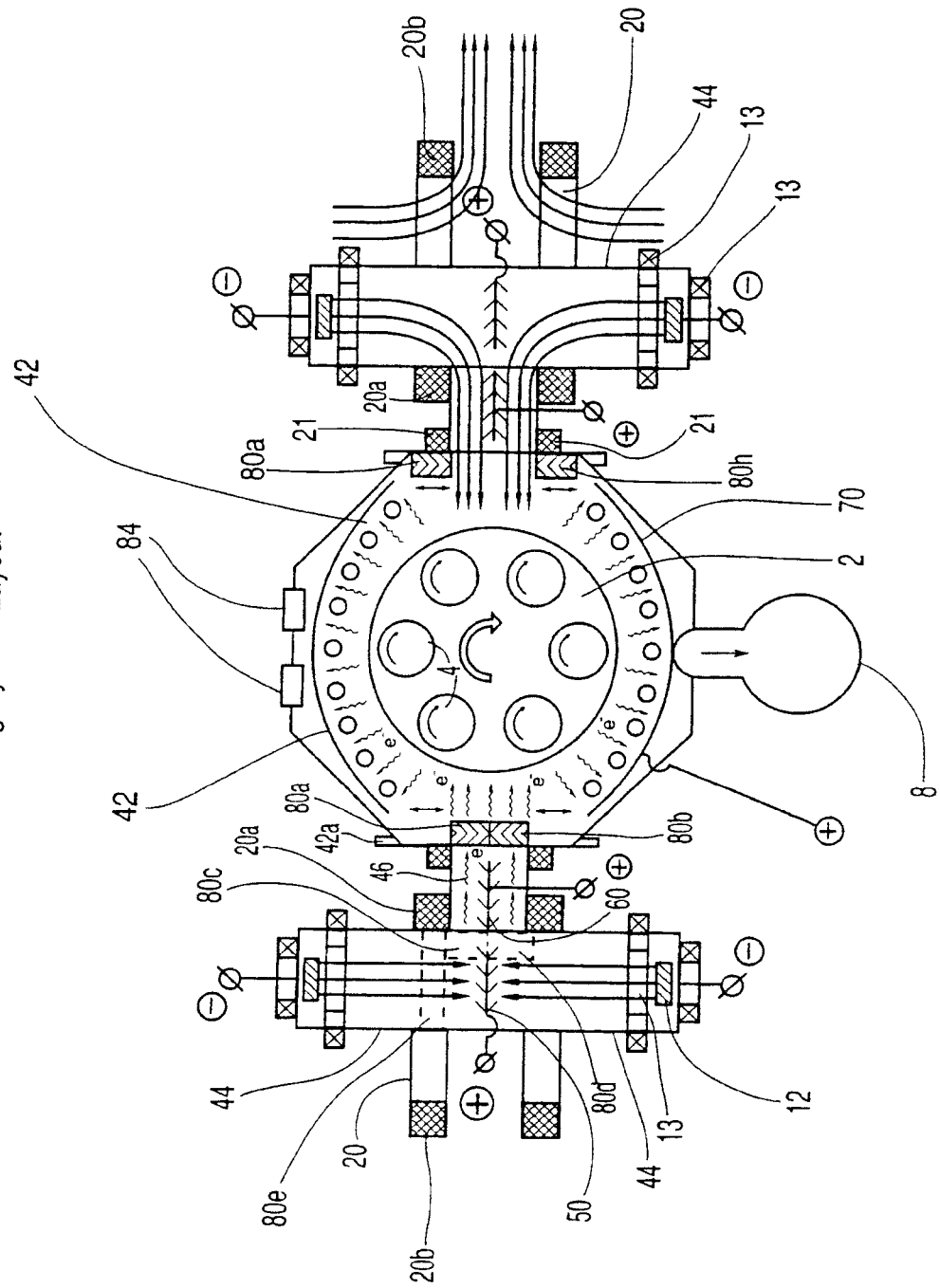
FIG. 3b is a schematic plan view of a double-channel dual-cathode filtered arc source vacuum arc coating apparatus embodying the invention.

A further preferred embodiment of the invention having a filtered arc source with two cathodes 12 at one end of a coating chamber 42 is illustrated in FIG. 3a. In this embodiment a vacuum arc coating apparatus 40 provides two plasma sources comprising cathodes 12 disposed within the filtered arc source comprising cathode chambers 44 positioned on opposite sides of the plasma duct 46. As in the previous embodiment, the cathodes 12 each comprise a cathode plate and are respectively surrounded by focusing and stabilizing electromagnets 13, and anodes 18 connected to the positive terminal of DC power supply 19. Plasma duct 46 is in communication with the coating chamber 42, in which a substrate holder 2 supporting substrates 4 is positioned off of the optical axes of both cathode sources 12. In the embodiment shown substrate holder 2 is biased to a negative potential by an independent power supply 26b.

In this embodiment a deflecting electrode 50, preferably comprising an electrode plate 50a optionally supporting baffles 50b, is positioned between the plasma sources 12, generally parallel to the direction of plasma flow through the plasma duct 46, and is isolated electrically from the walls of plasma duct 46 by an insulator 51. A conductive shield or shroud 52 may be provided to serve as a baffle for deflecting undesirable macroparticles discharged from cathodes 12 and to insulate the electrode 50 from contaminants. The shroud 52 may be optionally biased to a negative potential, which provides the advantages described below.

Figure 7:
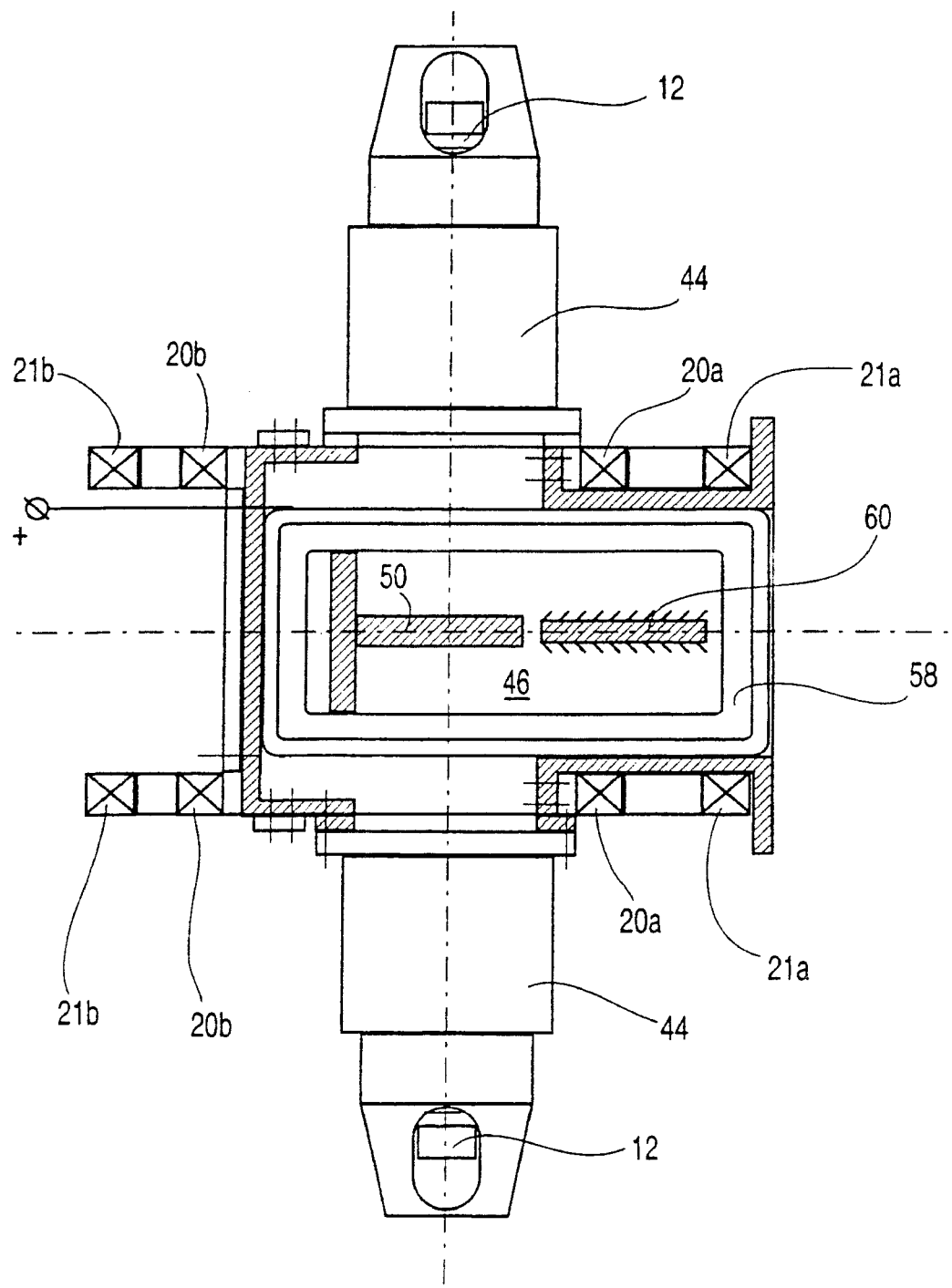
FIG. 7 is a cross-sectional view of a cathode pair in the arc coating apparatus of FIG. 4.

The magnetic deflecting system comprises coils 20 having deflecting conductors 20a proximate to the corners of the plasma duct 46 adjacent to the cathode chambers 44, and closing conductors 20b (for example as shown in FIG. 7) remote from the plasma duct 46 so as not to influence the direction of plasma flow.

The deflecting magnetic fields generated by the conductors 20a direct the plasma stream toward the substrates 4. As in the previous embodiment, in order to avoid plasma losses the cathodes 12 must be positioned within the cusps of the magnetic fields generated by deflecting conductors 20a of the deflecting coils 20.

Thus, with a pair of cathodes 12 disposed in a filtered arc source on opposite sides of the plasma guide 46, at least a portion of the deflecting electrode 50, and the repelling electrode 60, are disposed in alignment with a plane of symmetry between opposite walls of the plasma guide 46. The plane of symmetry extends between the magnetic cusps generated by deflecting conductors 20a, and the repelling electrode 60 is thus positioned between the cusps in a portion of the plasma duct 46 in which the tangential component of the deflecting magnetic fields is strongest.

In this embodiment a focusing coil 21 is disposed about the opposite end of the plasma duct 46, for generating focusing magnetic fields within the plasma duct 46. The focusing coil 21 may be a single coil, for example as shown in FIGS. 3a and 3b, or may comprise focusing conductors 21a disposed near the end of the plasma duct 46 in communication with the coating chamber 42, the closing conductors 21b therefor being disposed remote from the plasma duct 46 so as not to influence the flow of plasma, as shown in FIG. 7.

Figure 9:
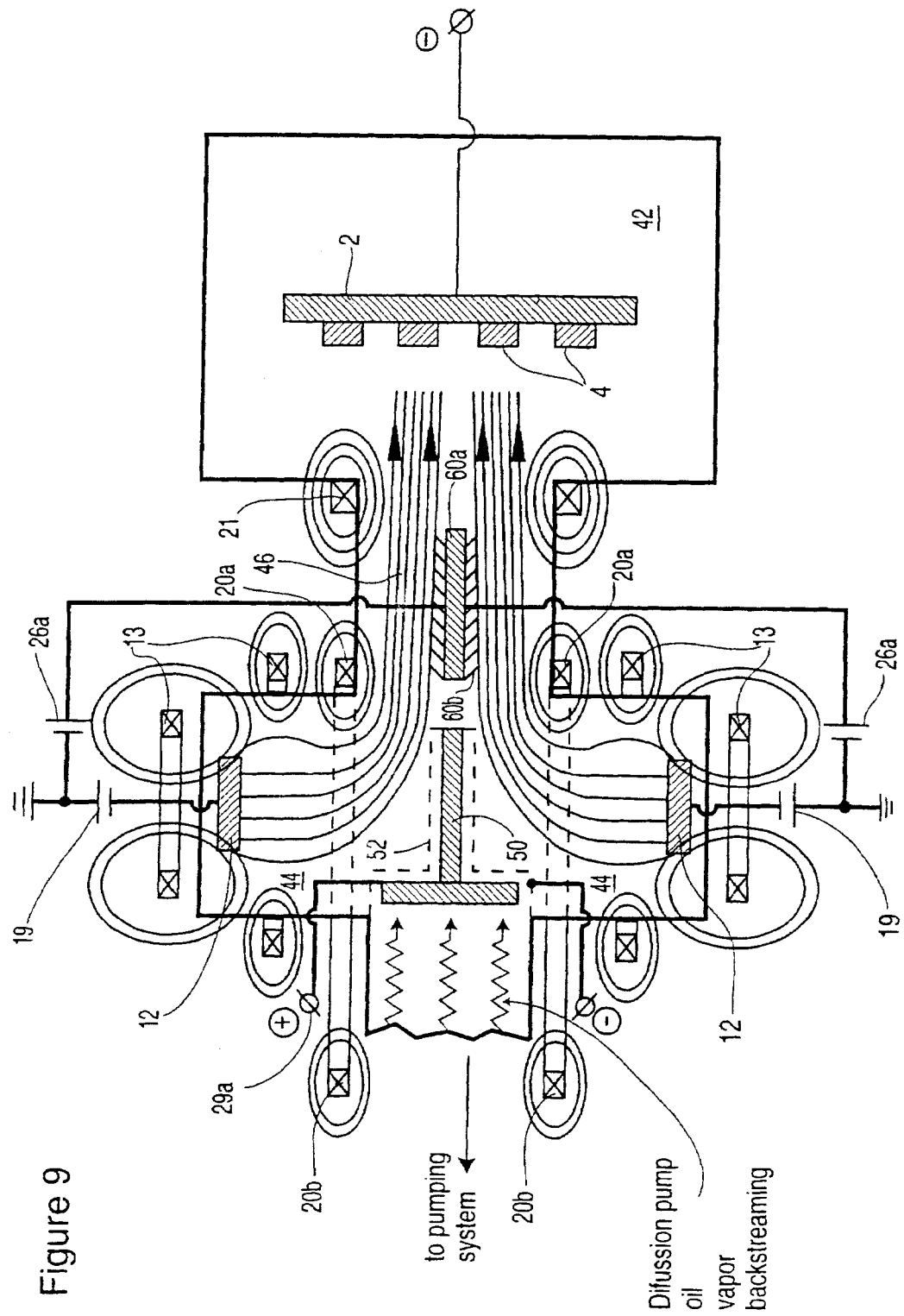
FIG. 9 is a schematic plan view of an embodiment of a vacuum arc coating apparatus with a getter pumping system, showing the deflecting electromagnetic fields produced by the deflecting and focusing magnetic coils.
Figure 10:
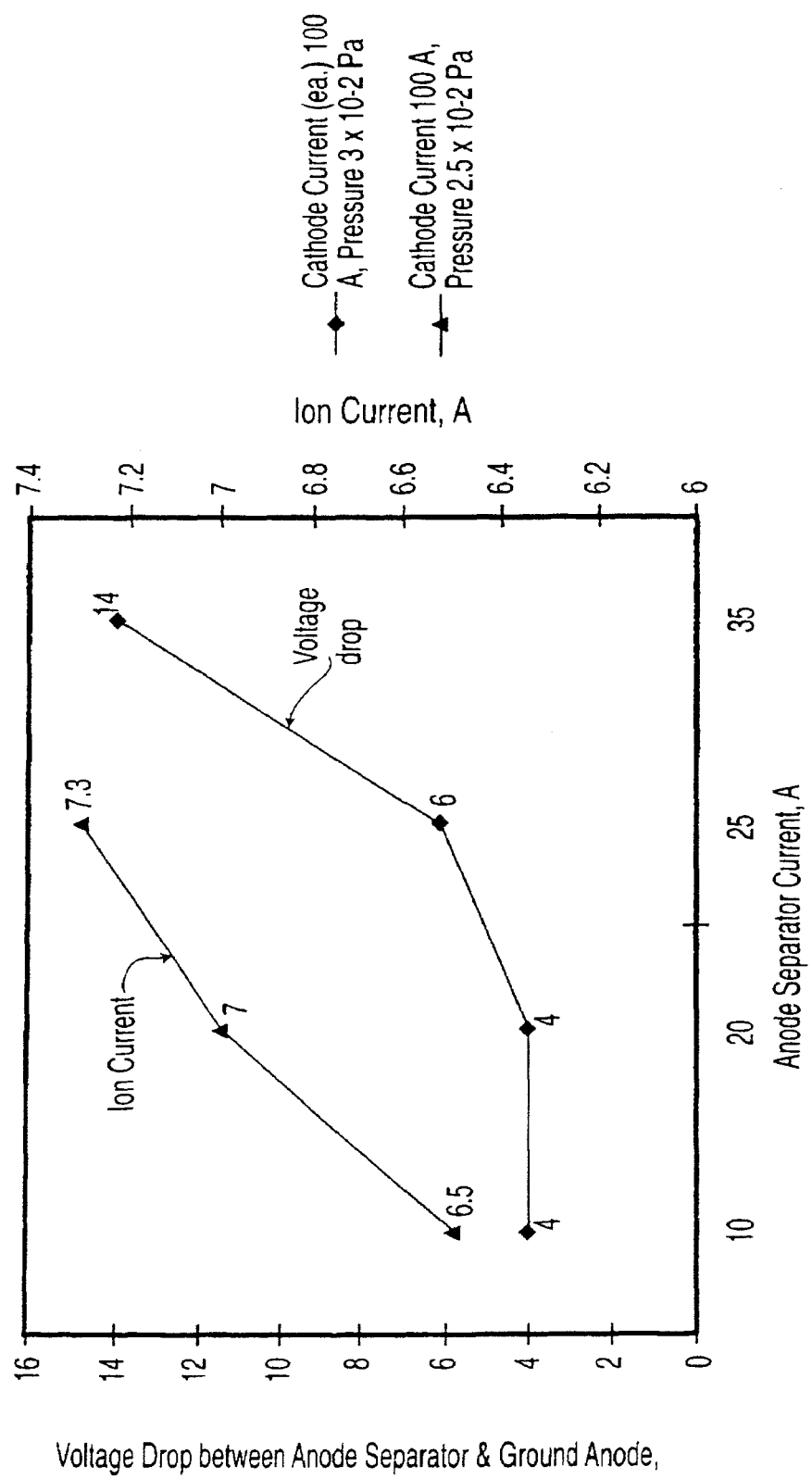
FIG. 10 is a graph illustrating the relationship between the repelling electrode voltage and the ion current as a function of the repelling electrode current in the arc coating apparatus of the invention.
Figure 11:
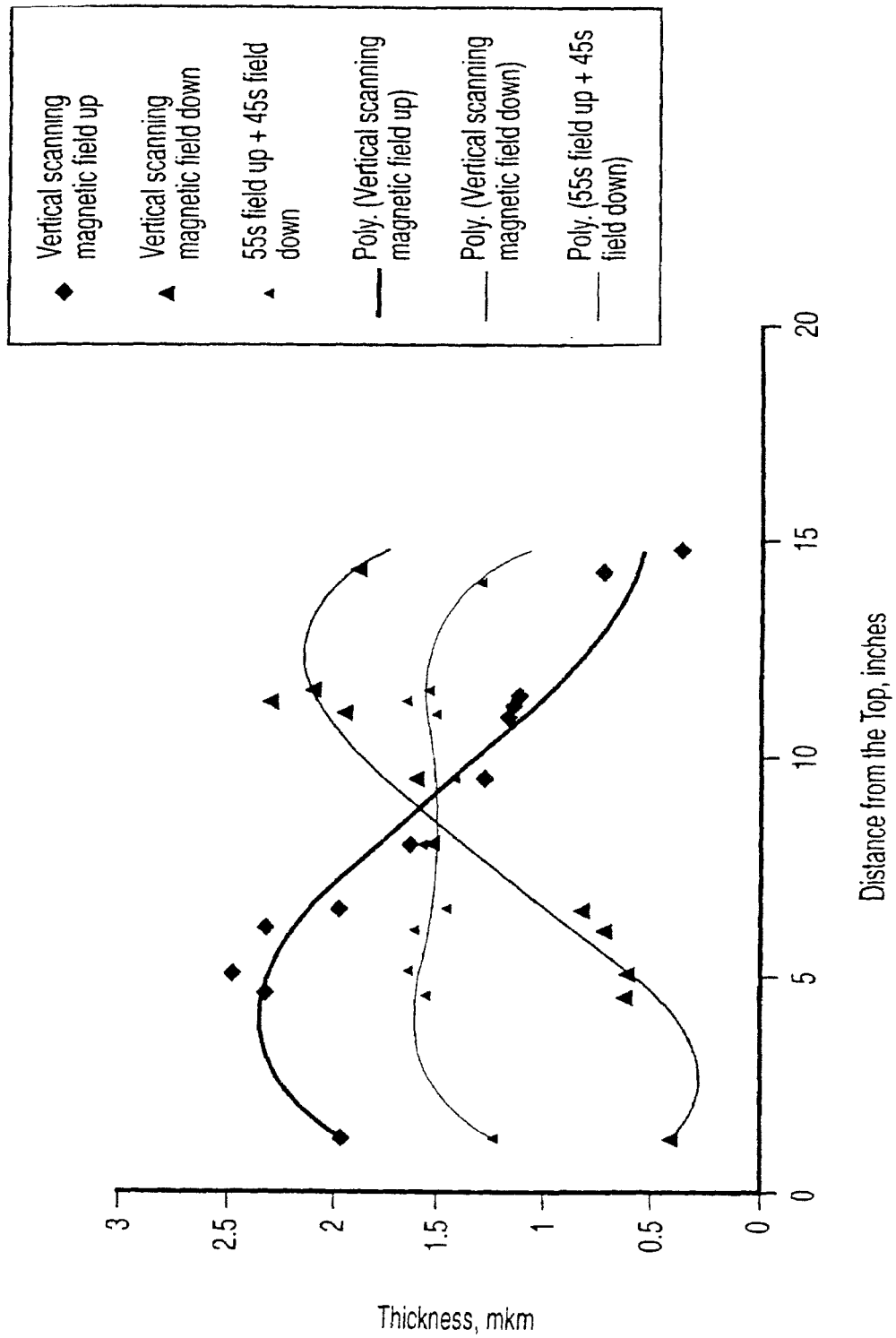
FIG. 11 is a graph illustrating coating thickness distribution as a function of the distance of the substrates from the top in the arc coating apparatus of FIG. 8c.

The focusing coil 21 (or focusing conductor 21a) generates a magnetic focusing field in the same direction as the deflecting magnetic fields generated by the deflecting coils 20, as shown in FIG. 9. Within the plasma duct 46 the transversal components of the focusing magnetic fields generated by the focusing conductor 21 substantially cancel the deflecting magnetic fields generated by the deflecting coils 20, minimizing the transversal components of these magnetic fields. The tangential components of these magnetic fields overlap and create a substantially uniform magnetic wall which confines the plasma stream away from the walls of the plasma duct 46.

As can be seen from equation 2 above, in order to increase the strength of the deflecting electric field the component of the magnetic field which is tangential to the surface of the deflecting electrode must be enhanced. Enhancing the tangential magnetic field component also has the effect of increasing magnetic insulation of the plasma from the deflecting electrode. However, increasing the strength of the magnetic field itself will cause the plasma stream to be misdirected toward the electrode, rather than deflected toward the intended target.

A repelling electrode 60 is thus positioned downstream of the deflecting electrode 50 within the plasma duct 46, preferably in the region between deflecting coils 20 and focusing coils 21, where the transversal component of the magnetic fields is weakest and the tangential component of the magnetic fields is strong. Repelling electrode 60, which preferably comprises an electrode plate 60a optionally supporting baffles 60b, is biased positively through a connection with the positive terminal of auxiliary DC power source 26a. It is advantageous to provide the repelling electrode 60 with a separate auxiliary current source 26a, either independent or in addition to another current source (for example 19 as shown in FIG. 3), since the repelling effect of the repelling electrode 60 is directly proportional to its potential. In the embodiment shown the negative terminal of DC source 26a is connected in series with one of the primary power sources 19, through diode 27, so that the repelling electrode 60 always maintains at least the same potential as the anodes 18, and auxiliary power source 26a is used to increase the potential of the repelling electrode 60 beyond the potential of anodes 18. DC sources 19 and 26a may alternatively be electrically independent.

An optional focusing electrode 23 may be provided surrounding the repelling electrode 60 near the exit of the plasma duct 46 (along the inner side of the wall of the housing), where the tangential component of the deflecting/focusing magnetic fields is strongest. Applying a positive potential to this focusing electrode, as shown in FIG. 3a, improves the transversal electric field in the same manner as the repelling electrode 60.

Figure 4:
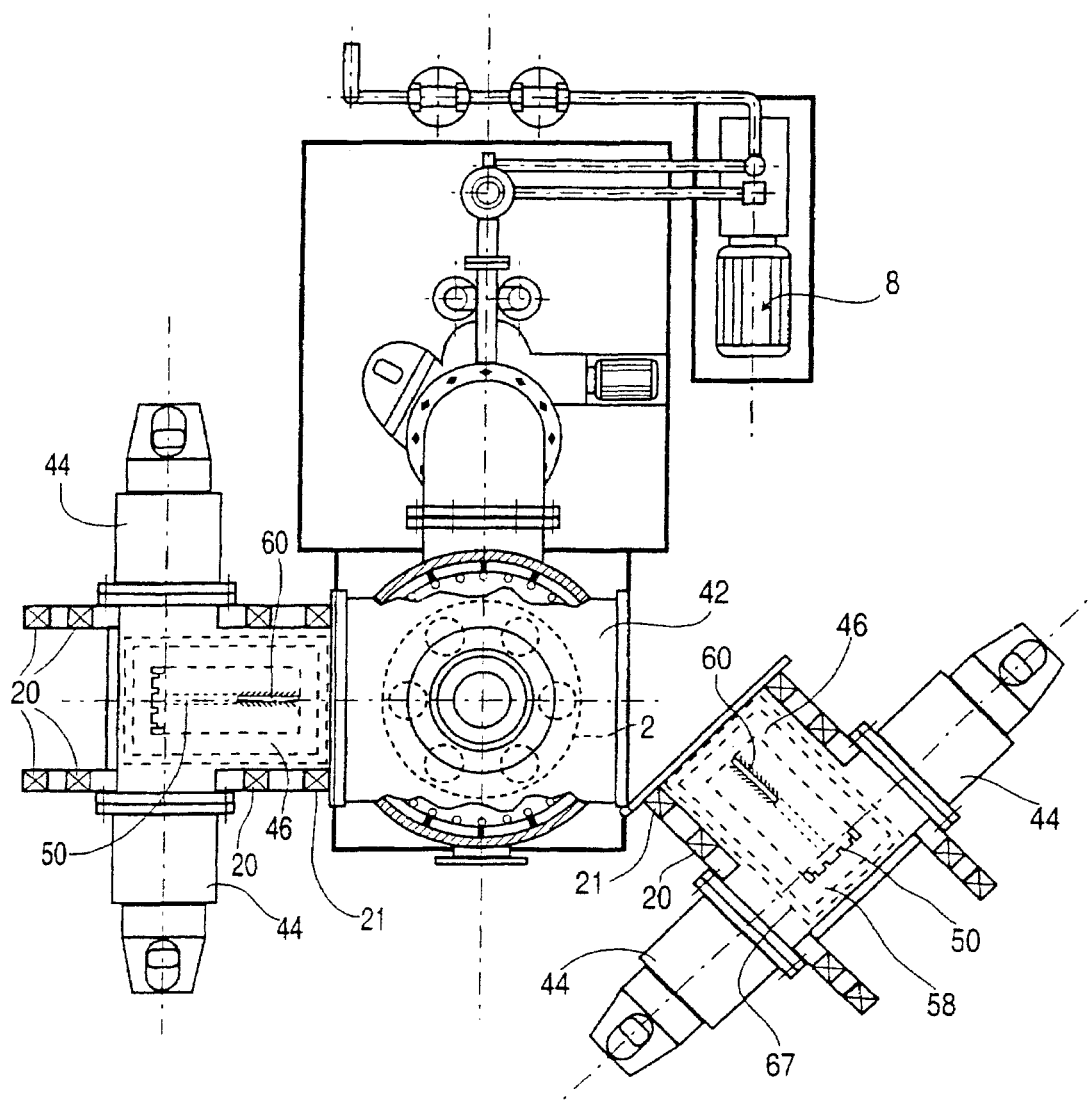
FIG. 4 is a top plan view of a further embodiment of the vacuum arc coating apparatus of FIG. 3 providing a plurality of cathode pairs.

In the operation of the apparatus of FIG. 3a, the substrates 4 to be coated are mounted on the substrate holder 2. The cathode chambers 44 and adjoining plasma duct 46 and coating chamber 42 are sealed and evacuated to the desired pressure using a conventional vacuum pumping apparatus (for example as shown in FIG. 4).

The power sources 19, 26a and focusing and deflecting coils 13, 20 are activated and an arc is ignited between each cathode 12 and its surrounding anodes 18. The plasma stream is ejected from cathode 12 and focused within the cathode chamber 44 by focusing electromagnets 13, which also drive the plasma toward the plasma duct 46. Magnetic focusing conductors 20a generate magnetic fields about the corners of the plasma duct 46 at the end adjoining the cathode chamber 44, to deflect the plasma stream through the plasma duct 46 and toward the coating chamber 42.

The deflecting magnetic fields generated by the deflecting conductors 20a deflect ionized components of the plasma towards the coating chamber 42, while neutral macroparticles remain unaffected and, entrained in the plasma being deflected out of the cathode chambers 44, strike deflecting electrode 50 and either adhere to it or fall to the bottom of the apparatus 40.

The plasma stream is deflected by deflecting coils 20, assisted by deflecting electrode 50, into the plasma duct 46 where it passes repelling electrode 60. As can be seen from the magnetic field lines shown in FIG. 8a, the deflecting magnetic fields surrounding the deflecting conductors 20a and focusing coil 21 have a strong tangential component (relative to the plasma stream) inside the plasma duct 46, which acts as a magnetic "wall" to isolate the walls of the plasma duct 46 from the plasma flow.

However, as the plasma flows between deflecting coils 20 and focusing coil 21, because the magnetic fields generated by coils 20, 21 traverse the walls of the plasma duct 46 in the same direction, in the region of overlap the transversal components of these deflecting magnetic fields substantially cancel and the tangential components are superposed to create a strong tangential magnetic "wall" which isolates the plasma from the wall of the plasma duct 46. In this region the repelling electrode 60 creates a strong electric field in a direction generally perpendicular to the plasma stream, which repels ions toward the walls of the plasma duct 46. The plasma is thus confined by the electric field generated by the repelling anode 60 and the magnetic fields generated by the deflecting and focusing magnetic coils 20, 21. This divides the plasma stream into two portions, one on either side of the repelling anode 60, which flow along the plasma duct 46 and merge downstream of the repelling electrode. This drives the plasma stream in a helical path toward the coating chamber 42, promoting a uniform plasma stream with a high ionization density entering the coating chamber 42.

The primary or "proximal" anodes 18 generate an arc which erodes the cathode 12 and creates a plasma for coating the substrates 4. The deflecting electrode 50 and repelling electrode 60 constitute "intermediate" auxiliary anodes, which deflect and repel the plasma stream within the cathode chamber 44 and plasma duct 46, and in dual-cathode embodiments divide the plasma stream as described above. FIG. 3a also illustrates a "distal" anode 70 disposed within the coating chamber 42, in this embodiment positioned on the side of substrate holder 2 opposite the plasma duct. The distal anode 70 assists in the deflection of the plasma stream in the direction of the substrates 4 before the plasma is pumped out of the apparatus 40. Preferably the distal anode 70 is energized by power sources 26b connected between the cathode 12 and the distal anode 70 (and optionally also by a separate power source 26c isolated by diodes 31), so that distal anode 70 always maintains at least the same potential as the repelling electrode 60, and auxiliary power source 26b is used to increase the potential of the distal anode 70 beyond the potential of repelling electrode 60.

The embodiment of FIG. 3b thus provides a chain of anodes, proximal anodes 18 local to the cathodes 12; medial anodes such as the repelling electrode 60 and focusing electrode 23, contained within the plasma duct 46, and distal anodes such as the anode 70, which may be disposed anywhere within the coating chamber 42. These anodes combine to create a desired dispersion of electrons and a uniform plasma cloud in the vicinity of the substrates 4. The anodes could be connected to independent power supplies, however this would result in high power consumption. The chain of anodes can alternatively be connected to the same power supply and rastered. Ionization of the plasma is maximized in the vicinity of an active anode, and rastering through the chain of anodes in this fashion allows for considerable conservation of power while maintaining a high plasma ionization level and mixing the plasma throughout the apparatus to create a uniform plasma immersed environment.

FIG. 3b illustrates a variation of the embodiment of FIG. 3a, in which a filtered arc source, each containing a pair of cathodes 12, is provided on both sides of the coating chamber 42. This embodiment can be used for plasma immersed treatment of substrates 4, by selectively deactivating the deflecting coil 20 and focusing conductor 21 on one side of the coating chamber 42. When all plasma sources 12 are active, plasma streams are generated in both cathode chambers 44. However, while the plasma stream generated on the side of active coils 20, 21 is guided into the coating chamber 42 by the deflecting and focusing magnetic fields, the particulate (metal vapour plasma) component of the plasma stream on the side of the inactive coils 20, 21 remains largely confined within the cathode chambers 44, there being no magnetic driving influence on that side of the coating chamber 42. The cathodes 12 on the side of the inactive coils 20, 21 thus serve as powerful electron emitters, improving ionization of the gaseous component of the plasma flowing past shutter 80a and into the coating chamber 42, and significantly improving the properties of the resulting coating.

Figure 8A:
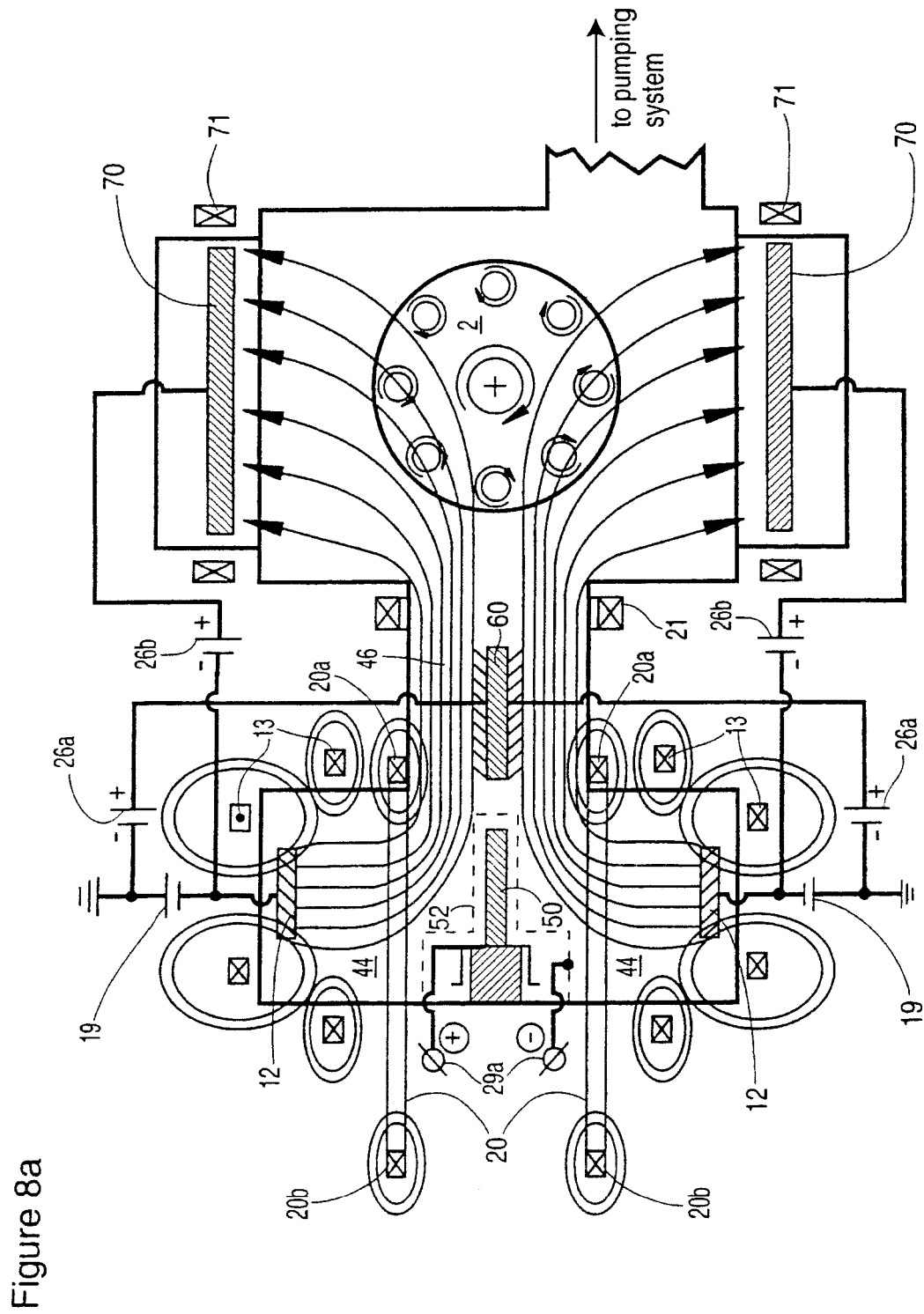
FIG. 8a is a schematic plan view of a dual cathodic vacuum arc coating apparatus providing auxiliary anodes within the coating chamber.
Figure 8B:
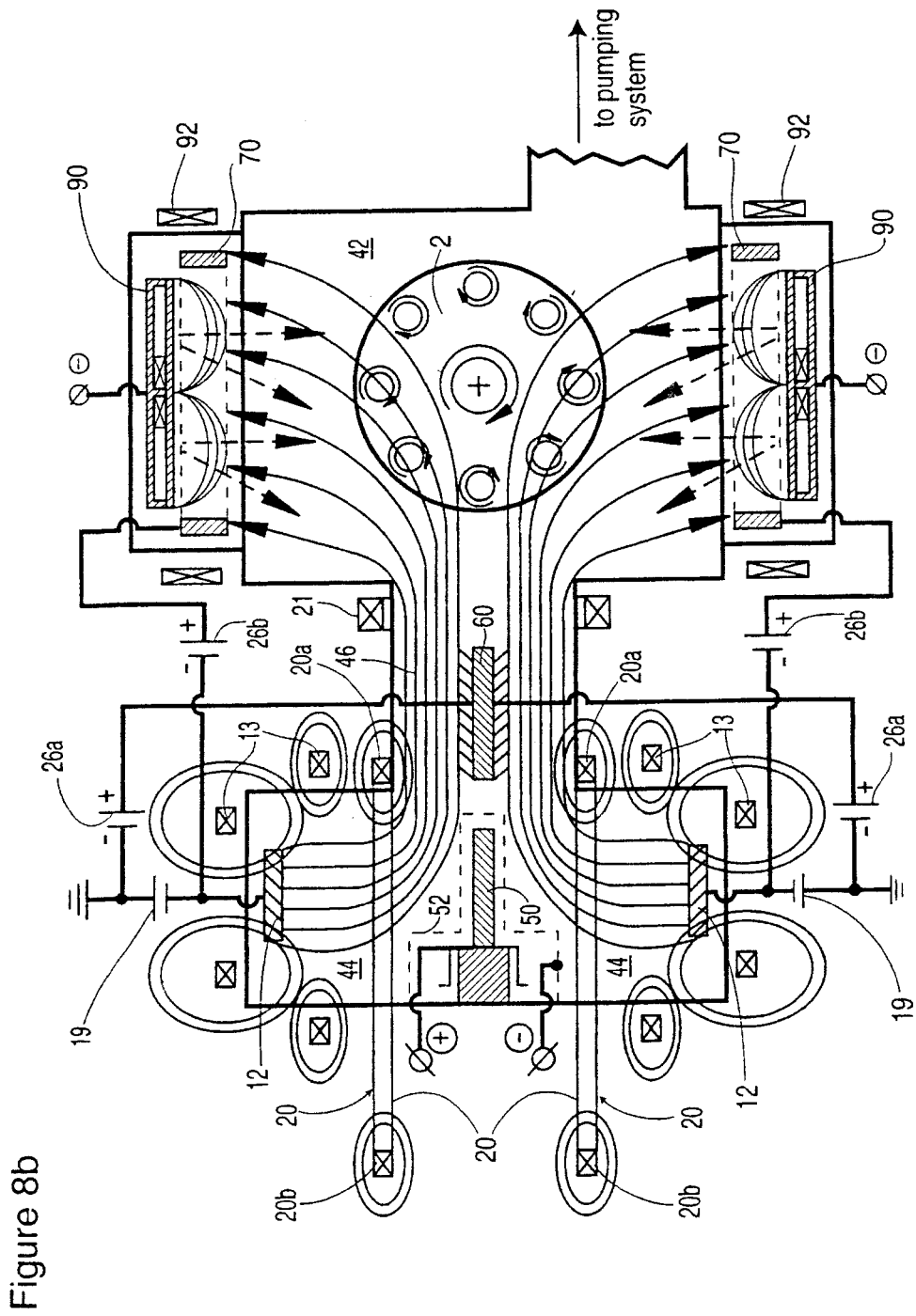
FIG. 8b is a schematic plan view of a dual cathode vacuum arc coating apparatus providing magnetron-arc sources within the coating chamber surrounded by an auxiliary arc anode.

In this embodiment the filtered arc source on the side of the coating chamber 42 with the deactivated coils 20, 21 is used for emitting electrons to provide a plasma immersed environment for coatings deposited by the other filtered arc source or, as in the embodiment of FIG. 8b, magnetron arc sources, or both. This embodiment of the apparatus can thus be used for any plasma-immersed process, including plasma assisted low pressure chemical vapor deposition (PALPCVD) processes.

Where a particularly contaminant-free coating is required, load lock shutters 80a, 80b may be disposed between each plasma duct 46 and the coating chamber 42. Each load lock shutter 80a, 80b comprises a grid made of stainless steel or another suitable metal having bars preferably between one-half inch and one inch in diameter and one-half inch to one inch openings between the bars, for example as shown in U.S. Pat. No. 5,587,207 issued Dec. 24, 1996 to Gorokhovsky, which is incorporated herein by reference. The load lock shutters 80 may be actuated manually, mechanically, or electrically, and are impervious to the particulate components of the plasma stream (ions and stray macroparticles) but pervious to electrons. Thus, to ensure that stray particles from the side of the inactive coils 20, 21 do not disperse into the coating chamber 42, the load lock shutters 80a, 80b are selectively independently closed or opened to respectively block or permit a flow of ions and stray macroparticles through to the coating chamber 42.

For example, as shown in FIG. 3b the shutter 80a can be opened while shutter 80b remains closed. All plasma sources 12 are active, and thus plasma streams are generated in both cathode chambers 44. However, while the plasma stream generated on the side of the open shutter 80a freely flows into the coating chamber 42, the particulate component of the plasma stream on the side of the closed shutter 80b remains confined within the cathode chamber 44 and plasma duct 46, upstream of the shutter 80b, both by the absence of deflecting and focusing magnetic fields and by the barrier created by the load lock shutter 80b.

The load lock shutters 80a, 80b may be maintained at a floating potential, or a strong negative potential may be applied in which case the load lock shutter 80a or 80b will also serve as an ion accelerator, actively forcing positive ions generated by cathodic arc sources inside of plasma guide chamber, into the coating chamber 42 in a manner similar to a Kaufman type ion beam source. Diagnostic ports 84 may optionally be provided to accommodate sensors and/or probes for monitoring the environment within the coating chamber 42.

This embodiment of the apparatus can thus be used for any plasma-immersed process, including plasma assisted chemical vapor deposition (CVD) processes. To facilitate plasma immersed processes, the distal auxiliary anodes 70 surround the rotating substrate holder 2, and thereby help to disperse the plasma uniformly within the coating chamber 42, for example as shown by the plasma flow lines in FIG. 8a, by attracting the ionized gaseous component to all portions of the coating chamber walls.

The operation of this embodiment is similar to the operation of the embodiment of FIG. 3a, except that in this embodiment the deflecting coils 20 and focusing coil 21 on the side of the closed load lock shutter 80b are deactivated during the plasma immersed process, so that the plasma is not driven through the plasma duct 46 on that side of the apparatus. Even without the load lock shutters 80a, 80b the plasma on the side of the apparatus in which the deflecting coils 20 and focusing coil 21 are deactivated will remain largely confined within the filtered arc source, there being no electromagnetic influence to drive the plasma out of the cathode chamber 44. Electrons will disperse into the plasma duct 46 and coating chamber 42. The closed load lock shutter 80b assists in maintaining the purity of the coating by completely excluding stray ions and macroparticles from entering the coating chamber 42, however the load lock shutters 80a, 80b are not strictly necessary for all plasma immersed applications. It should also be noted that the embodiment of FIG. 3a provides proximal anodes 18 for generating an arc discharge at the cathodes 12, whereas in the embodiment of FIG. 8a the positive pole of the power source 19 for the cathode 12 is grounded so that the cathode chamber housing serves as a proximal anode for the cathode 12.

Also, the embodiment of FIG. 8a provides magnetic deflecting coils 71 surrounding the distal auxiliary anodes 70, which serve to deflect the plasma flow past the substrates 4 within the coating chamber 42. The magnetic fields generated by deflecting coils 71 extend well beyond the electric fields generated by the auxiliary anodes 70, and the plasma flow is dispersed along the magnetic field lines produced by deflecting coils 71. In order to ensure that the plasma is dispersed toward the auxiliary anodes 70, the magnetic fields generated by the deflecting magnetic coils 71 should be oriented in the same direction as the focusing magnetic fields generated by the focusing coils 21. The coils 71 surrounding anodes 70 also allow for the redirection of the plasma flow from one distal anode 70 to another, and the plasma flow can thus be rastered within the coating chamber 42 for a more even coating on the substrates 4.

The distal auxiliary anodes 70 can be disposed tangential to the magnetic force lines generated by the deflecting magnetic coils 71, which increases the anode voltage drop and transfers more energy into the plasma; or the distal auxiliary anodes 70 can be disposed transversely to the magnetic force lines generated by the deflecting magnetic coils 71, which to increase the stability of the auxiliary arc discharge and the uniformity of plasma distribution. A plurality of distal auxiliary anodes 70 can be positioned to provide a combination of tangential and transversal anode surfaces, and switching the arc current between these anodes 70 creates a plasma blender, which equalizes the plasma treatment of the substrates 4.

In an apparatus with a single dual-cathode filtered arc source having first and second cathodes 12 installed on opposite walls, for example the embodiment of FIG. 8a, it is not possible to generate ions from one cathode 12 and electrons from the other cathode 12, since the filtered arc source can generate only one type of particle at a time: either ions or electrons, depending on whether its associated deflecting system is activated (to generate metal ions) or deactivated (to generate electrons). When the cathodic arc sources are activated the filtered arc source can generate electrons by creating an auxiliary arc discharge between the cathode 12 and the distal anode 70 disposed in the coating chamber 42. Thus, in a filtered arc coating mode the filtered arc source will generate metal ions, while in the auxiliary arc discharge mode the filtered arc source will generate electrons to provide plasma immersed environment for ion cleaning (etching), ion nitriding, ion implantation, and plasma assisted low pressure CVD (PALPCVD) processes.

It is however possible to provide load lock shutters 80c, 80d between the filtered arc source and the plasma duct 46, for example as shown in phantom in FIG. 3b, each load lock shutter 80c or 80d being positioned such that when closed it blocks the magnetic cusp generated by the deflecting magnetic system only on one side of the plasma duct 46. Cathodic evaporate from the cathode 12 on that side of the filtered arc source, being trapped within the magnetic cusp, will thus be confined within the filtered arc source by the load lock shutter 80c or 80d, while cathodic evaporate from the cathode 12 on the other side of the filtered arc source will flow along the (unblocked) magnetic cusp into the plasma duct. This creates a plasma immersed environment from a single dual-cathode filtered plasma source, and/or allows for the sequential deposition of coatings of different types on the substrates 4. When the load lock shutters 80c, 80d installed at the exit of a filtered arc source are charged with negative potential, they function as a positive ion beam source (ion extractor), in which case a preferred size of the openings in the load lock shutter is in the range of 100 µm to 1000 µm. When set up with a floating or slightly positive potential, the load lock shutters 80c, 80d become transparent to the electrons of the auxiliary arc discharge, flowing between the cathode 12 of the filtered arc source and the distal auxiliary anode(s) 70 installed in the coating chamber 42.

This positioning of the load lock shutters 80c, 80d between the filtered arc source and the plasma guide 46 can also be implemented in the single-filtered arc plasma source embodiments, for example the embodiment of FIG. 8b, either in addition to or instead of the load lock shutters 80a, 80b shown between the plasma duct 46 and the coating chamber 42. As shown in phantom in FIG. 3b, a load lock shutter 80e can also be positioned between any cathode 12 and its adjacent deflecting electrode 50 in a filtered arc source, to block cathodic evaporate from reaching the deflecting electrode 50 and provide an extremely clean electron flow with virtually no metal vapor dispersion into the plasma duct 46. This can be important in processes such as semiconductor applications, where even a very low metal vapor component can contaminate the substrates 4.

Rastering through the chain of proximal-medial-distal anodes in these embodiments allows for the opportunity to sustain the arc between anodes in different stages of the apparatus, which cleans the plasma flow in each stage and draws electrons into the next stage for a maximized plasma immersed environment.

It is also possible to provide different metal target in the opposed cathodes 12 of a single filtered arc source, to allow the deposit composite coatings. For instance, in the apparatus of FIG. 8b the evaporation surface of one cathode 12 can be titanium and the evaporation surface of the other cathode 12 can be aluminum, and with the introduction of gaseous nitrogen can produce a composite TiAlN coating. Using the same evaporation surface for one filtered arc source, but different evaporation surfaces for other filtered arc sources (installed on the different walls of coating chamber) allows for the deposit of multi-layer coatings like TiN/CrN. Where the different evaporation surfaces are employed in the same filtered arc source (installed on the opposed cathodes 12) a composite coating (such as TiCrN) can be obtained. This is an important advantage in the use of multiple-cathodes and multiple-filtered arc sources.

It will also be appreciated that in a multiple-filtered arc source embodiment, such as the embodiment of FIG. 3b, the cathodes 12 of different cathode pairs (i.e. different filtered arc sources) can be composed of different materials. Accordingly, by selectively deactivating the deflecting coils 20 and focusing coil 21 on one side of the apparatus (and optionally opening and closing the load lock shutters 80a, 80b) it is possible to apply two different types of coatings to the substrates 4, each in a plasma immersed environment.

Figure 8C:
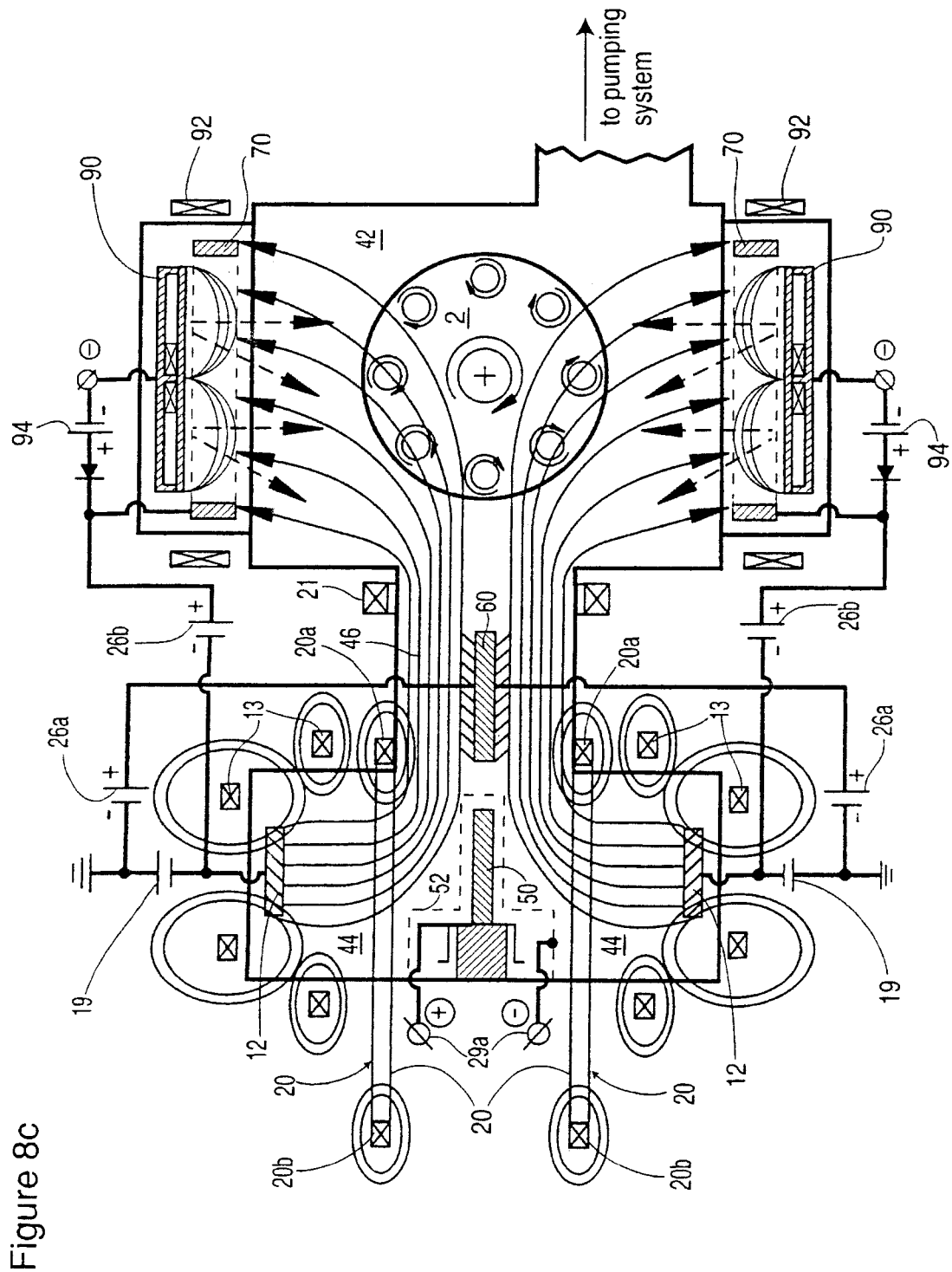
FIG. 8c is a schematic plan view of a further embodiment of a dual cathode vacuum arc coating apparatus providing magnetron arc sources within the coating chamber surrounded by an auxiliary arc anode.

FIGS. 8b and 8c illustrate a still further variation of this embodiment, in which the distal auxiliary anodes 70 also serve as anodes for magnetron arc plasma sources 90 disposed within the coating chamber 42, optionally surrounded by focusing/steering coils 92. In these embodiments a dense plasma can be generated within the coating chamber 42 by the combination of plasma streams from the cathodes 12 and plasma streams from the magnetrons 90. The magnetrons 90 may be maintained at a high negative potential by grounding the positive pole of the magnetron power source, as illustrated in FIG. 8b, or may be provided with a separate power source 94 as illustrated in FIG. 8c. In both of these embodiments the magnetrons 90 may constitute the primary source of cathodic material, and the cathodes 12 can serve as electron emitters, in the manner previously described, by deactivating the deflecting coils 20 and focusing coil 21 and optionally providing load lock shutters (not shown) between the plasma duct 46 and the coating chamber 42.

The main disadvantage of magnetron sputtering is a relatively low ionization degree (1 to 3%) and, as a result, a low ion bombardment rate of the substrate 4 to be coated. That leads to poor structure and low adherence of coatings. In addition, the productivity of this process is proportional to the concentration of sputtering gas ions (usually $Ar^+$ ions), which have a high sputter rate and also cause sputtering of the substrates 4. For example, U.S. Pat. No. 5,160,595 to Hauzer proposes an arc/magnetron coating deposition method in which an edge magnet arrangement is displaceable in the axial direction relative to a preferably fixedly mounted center pole permanent magnet. In this apparatus a cathode sputtering process and/or cathodic arc evaporation process can be achieved depending upon the relative position of the edge magnet arrangement and the center pole magnet. During the transition from arc operation to magnetron operation, both the low voltage power supply supporting the arc mode and the high voltage power supply supporting the magnetron mode are enabled, to create discharge between negative charged target and positive charged anode. As a rule the arc mode is used only for the ion cleaning stage of process. The principal disadvantages of this process is the presence of microparticles of the cathode material in the vapor stream in an arc mode, and a relatively low ionization of sputtered target atoms in the magnetron mode.

The embodiments of FIGS. 8b and 8c overcome these disadvantages by providing a filtered arc plasma immersed magnetron apparatus having separate cathodes 12 installed in the filtered arc source and magnetron cathodes 90 installed in the coating chamber 42 off of the optical axis of the arc cathodes 12. The distal auxiliary anodes 70 can be installed anywhere in the coating chamber 42, but preferably are disposed in the vicinity of the magnetron sources 90, surrounding the magnetron targets. The distal auxiliary anodes 70 in this configuration thus also serve as arc/magnetron anodes, which are common to both the cathodic arc plasma source 12 (as a distal auxiliary anode 70) and as a magnetron anode for the magnetron source 90 to thereby create both arc-discharge and magnetron-discharge simultaneously. This "arc enhancement magnetron discharge", which is essentially the magnetron discharge immersed in highly ionized filtered arc plasma environment, provides the best features of both types of discharges: a high rate of ionization through the arc discharge process and high rate of target atomization through the magnetron sputtering process.

Figure 8D:
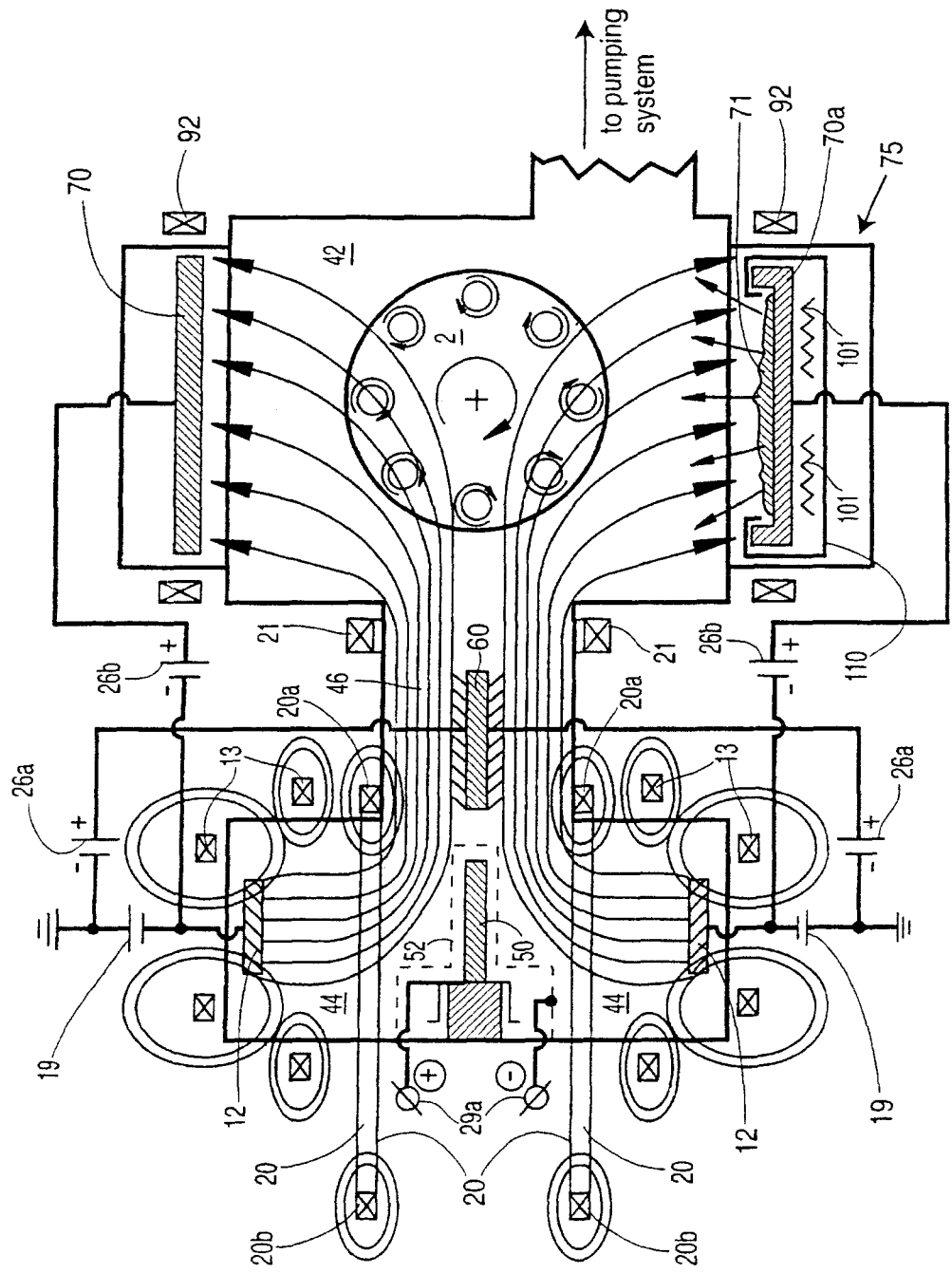
FIG. 8d is a schematic plan view of a dual cathodic vacuum arc coating apparatus providing a resistive evaporation hot anode (REHA) arc plasma source within the coating chamber.

FIG. 8d illustrates a still further variation of the embodiment of FIGS. 8b and 8c, in which one of the distal auxiliary anodes 70a (the bottom one) also serves as a crucible for evaporation metals 71 having low or moderate melting points, optionally surrounded by focusing/steering coils 92. In these embodiments a dense plasma can be generated within the coating chamber 42 by the combination of plasma streams from the cathodes 12 and plasma stream from the resistive evaporation hot anode-crucible (REHA) arc plasma source 75, heated by the anode arc current and regular resistance heaters 101. The shield 110 may be maintained around the crucible 70a to restrict the anode-evaporating zone. For the same purpose, the internal part of the sidewall of the REHA's crucible can be made of insulating ceramic as of alumina or boron nitride (not shown). Concentrating the auxiliary anodic arc plasma on the surface of evaporating metal results in increase of ionization rate of metal vapor plasma, generated by the REHA arc plasma source 70a. The cathodes 12 can serve as electron emitters, in the manner previously described, by deactivating the deflecting coils 20 and focusing coil 21 and optionally providing load lock shutters (not shown) between the plasma duct 46 and the coating chamber 42. Alternatively, the cathodes 12 can supply additional filtered arc plasma stream to merge with metal vapor plasma stream coming from the REHA-crucible 70*a*.

Figure 8E:
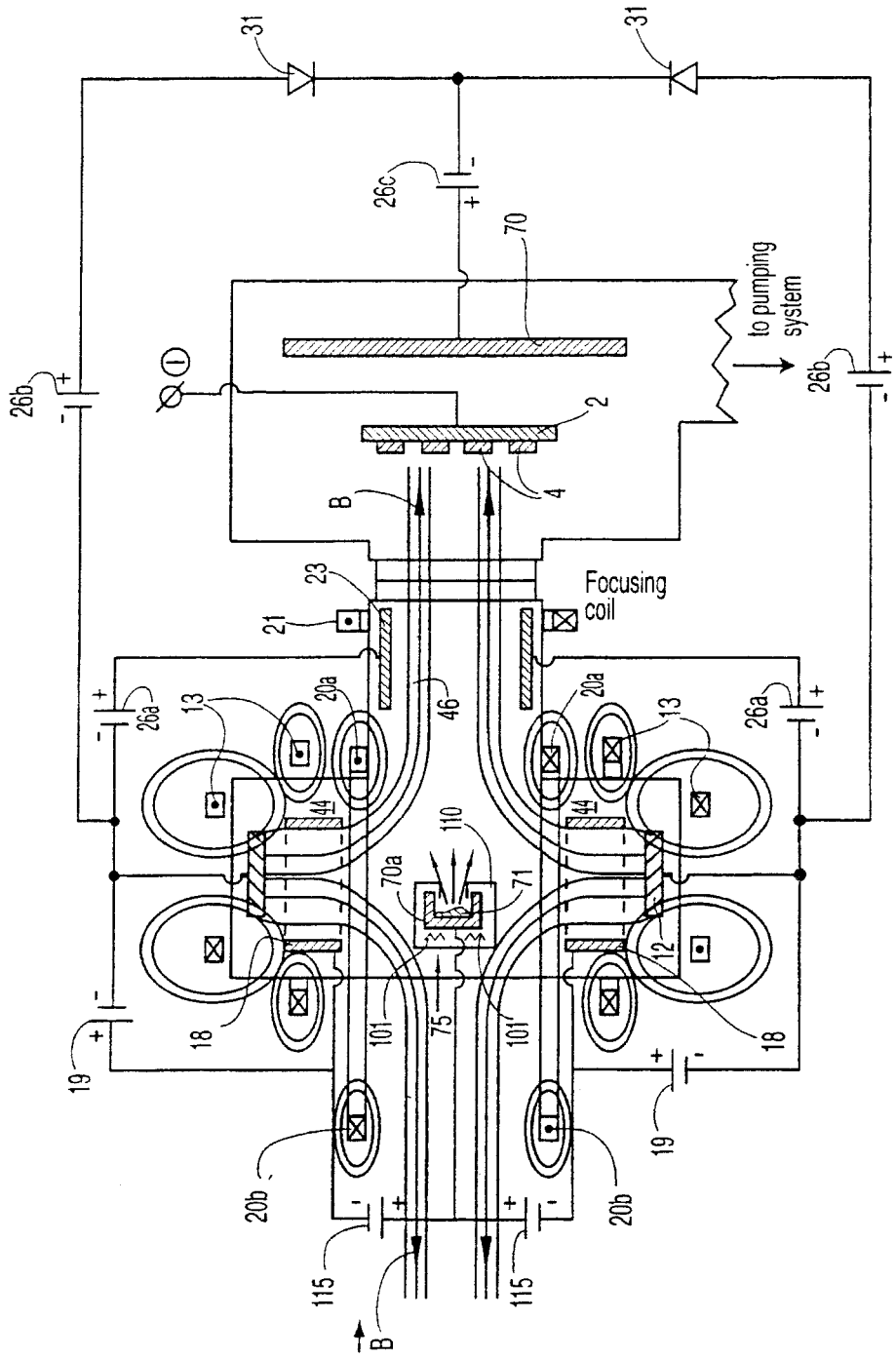
FIG. 8e is a schematic plan view of a dual cathodic vacuum arc coating apparatus providing a resistive evaporation hot anode (REHA) arc plasma source within the plasma duct.

In a preferred variation of this embodiment, illustrated in FIG. 8*e*, the REHA-metal vapor plasma source 75 is installed inside of the plasma duct 46 of the dual cathode filtered arc source in the area where the deflecting magnetic field is smallest, which is the central area of the deflecting magnetic field cusp. In this case the metal vapor will be partially ionized by interaction with anode arc plasma and propagates toward the substrate to be coated along magnetic field lines of the deflecting magnetic field. Diffusion losses of metal vapor plasma are well suppressed by the convex magnetic field of the deflecting magnetic cusp.

Figure 8F:
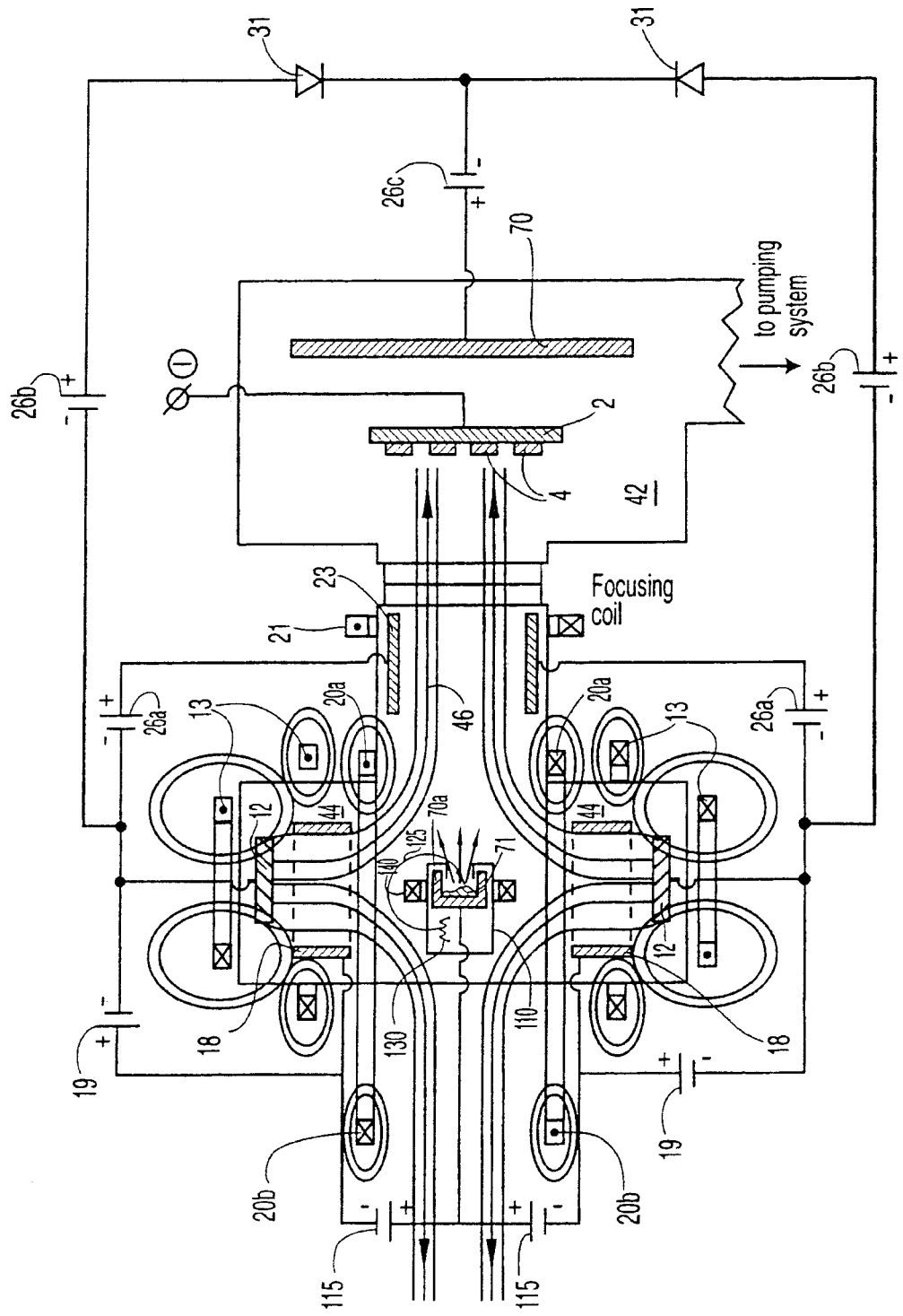
FIG. 8f is a schematic plan view of a dual cathodic vacuum arc coating apparatus providing an electron beam evaporation hot anode (EBEHA) arc plasma source within the plasma duct.

In a further variation of this embodiment, illustrated in FIG. 8*f*, an electron beam evaporator is used instead of a resistance heater to evaporate metal from the anode-crucible 70*a*. The electron beam 125 generated by thermoionic cathode 130 is turned on to 270 degrees by a magnetic field transversal to the plane of FIG. 8*f*. This is important in this embodiment of the invention, to keep the electron beam in the vicinity of the centre of the deflecting magnetic field cusp, where intensity of the deflecting magnetic field is negligible and does not influence the trajectory of electron beam 125. This device optionally provides a compensating magnetic coil 140, surrounding the electron beam evaporator, to correct the trajectory of the electron beam 125 to ensure that it strikes the evaporating metal in the crucible. The ionization of metal vapor will increase by maintaining the crucible at anode potential, while the shield 110 can be insulated and have a floating potential. In this case, an anodic arc spot will be created on the surface of evaporating metal in the anode-crucible, boosting the ionization rate of metal evaporate to more than 60% for metals having low and medium melting points. The metal vapor plasma then merges with the cathodic arc plasma generated by cathodes 12 and flows toward the substrate to be coated. The focusing electrode 23 has to be installed on the exit of plasma duct 46 adjacent to the main vacuum chamber 42, to repel metal ions and focus the metal plasma flow toward substrate to be coated.

Figure 8G:
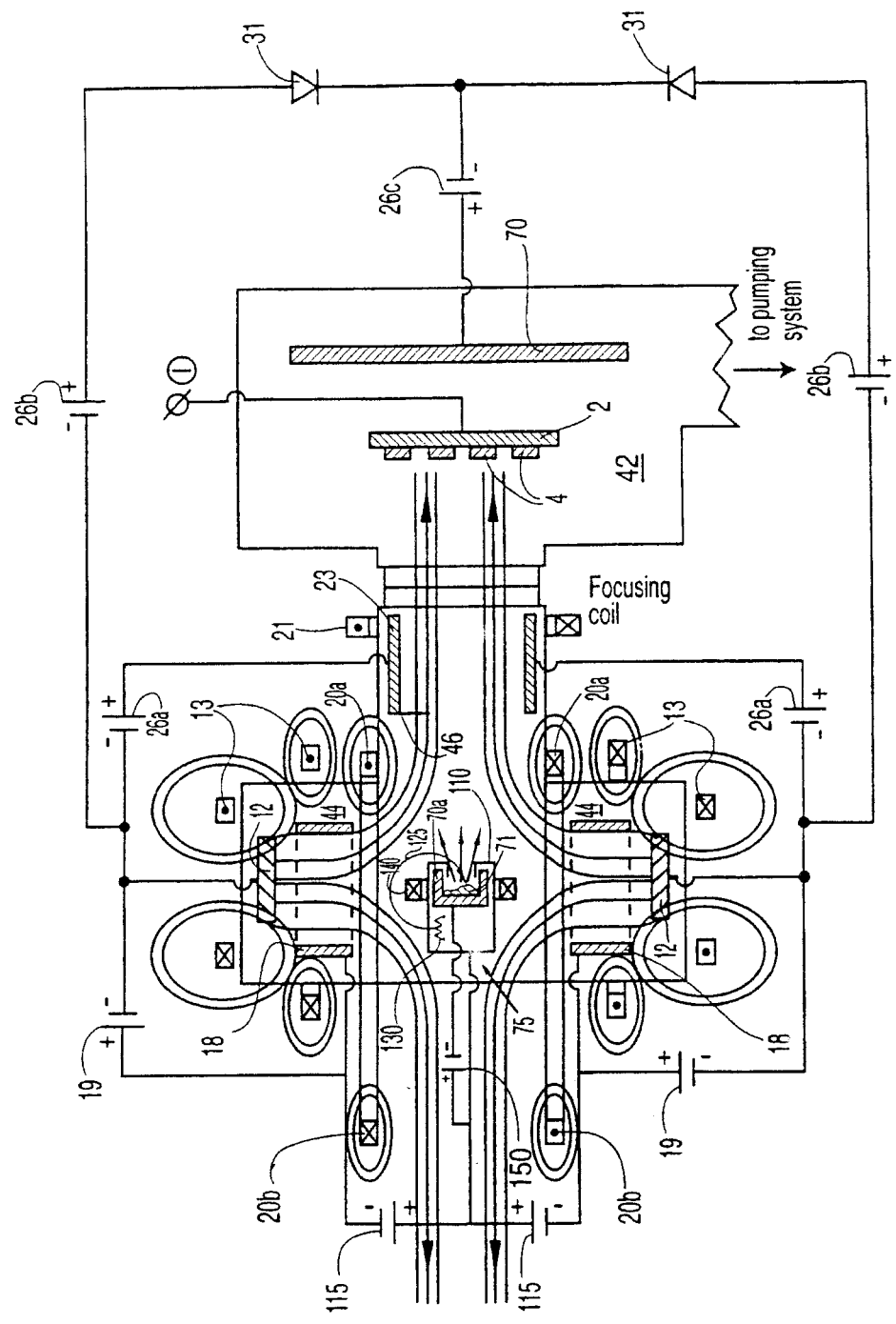
FIG. 8g is a schematic plan view of a dual cathodic vacuum arc coating apparatus providing an electron beam evaporation hot cathode (EBEHC) arc plasma source within the plasma duct.

In the case of evaporating refractory metals, the crucible in the electron beam evaporator can be maintained at cathode potential while the surrounding shield can serve as a local proximal anode, as is illustrated in FIG. 8*g*. In this case, the ionization rate of metal vapor can reach 90 to 100% by creating a diffused cathodic arc spot in the place where the electron beam impact evaporates metal in the crucible-cathode.

Figure 8H:
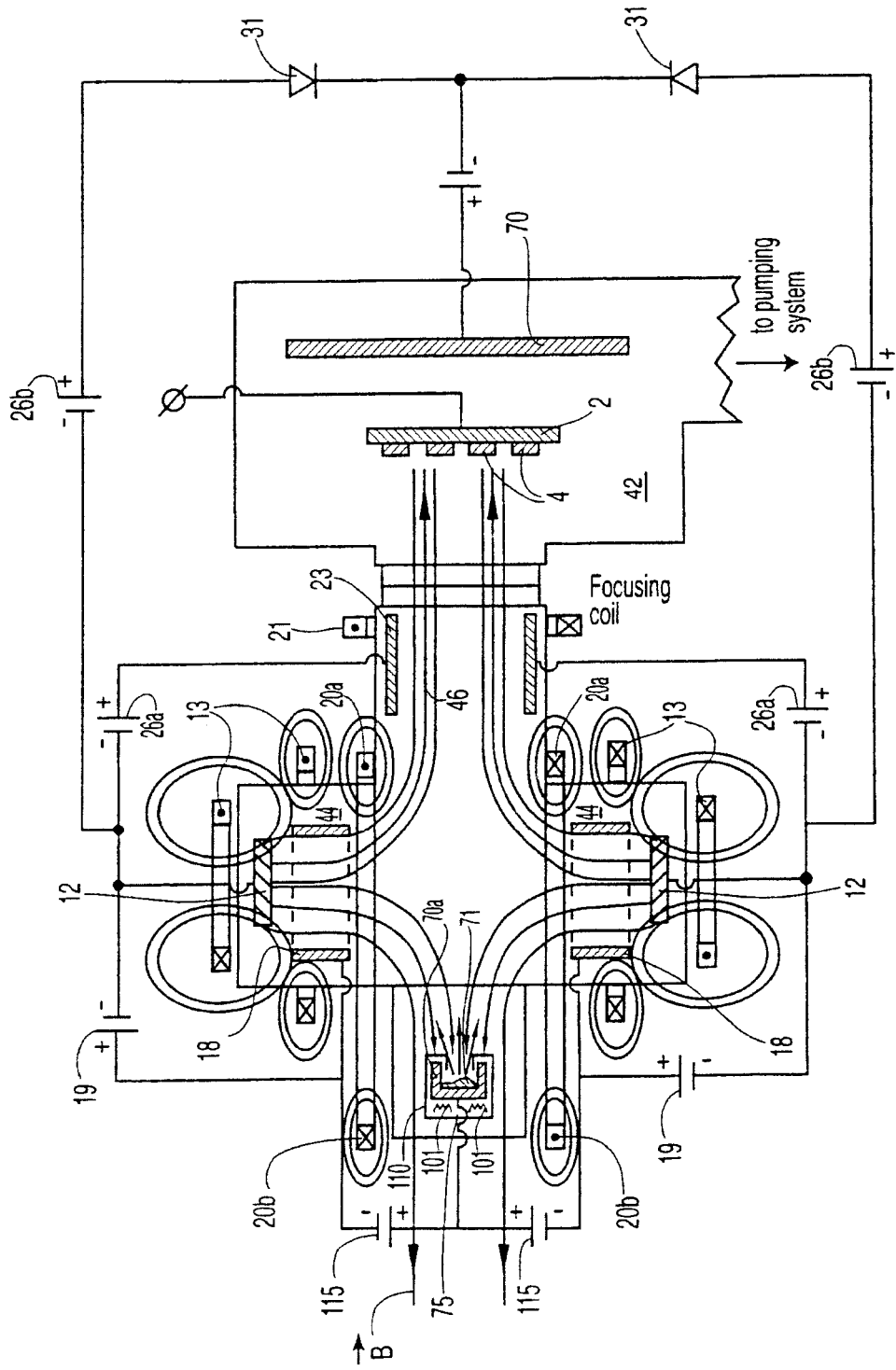
FIG. 8h is a schematic plan view of a further embodiment of a dual cathodic vacuum arc coating apparatus providing a resistive evaporation hot anode (REHA) arc plasma source within the plasma duct.
Figure 8:
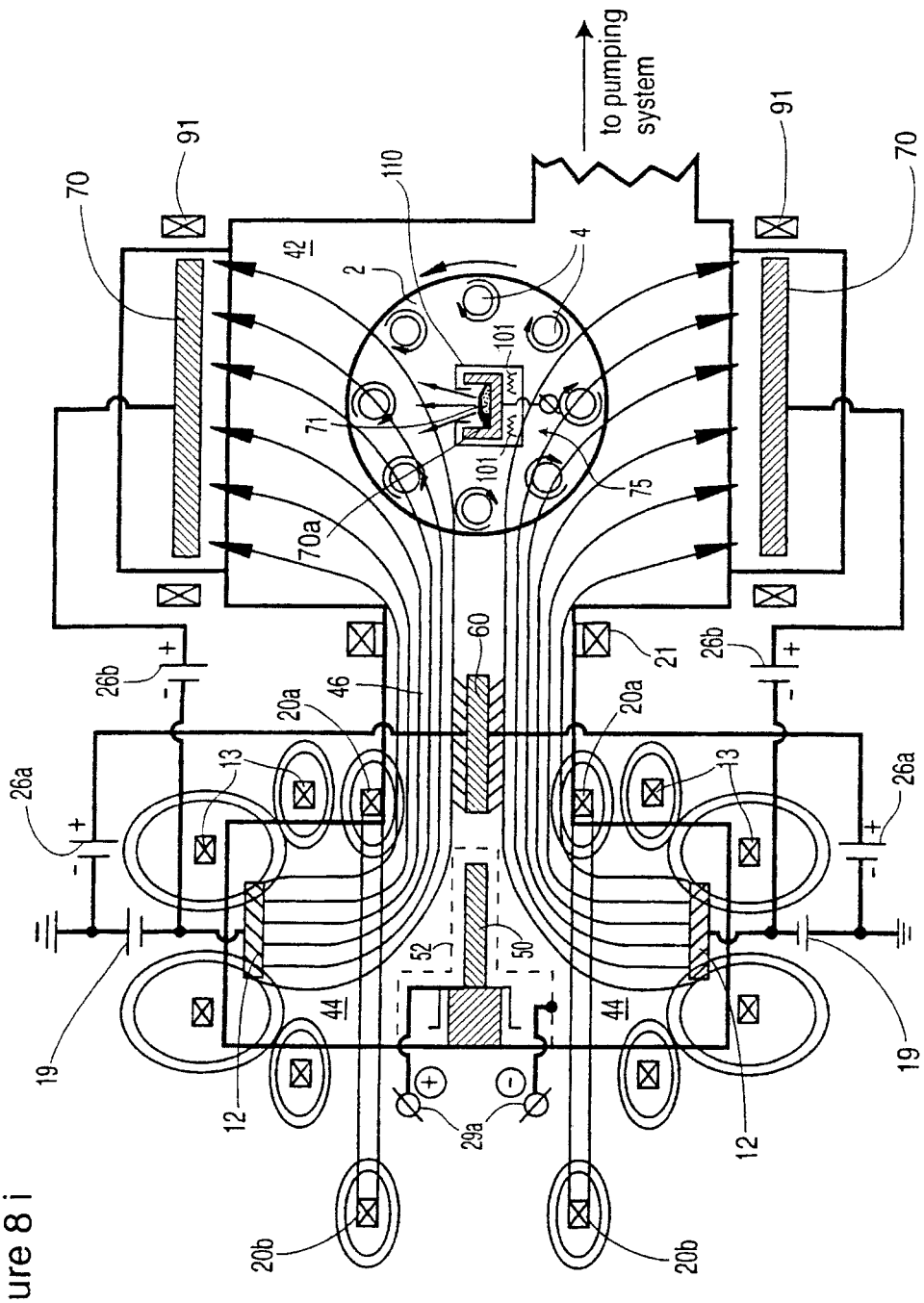
FIG. 8i is a schematic plan view of a further embodiment of a dual cathodic vacuum arc coating apparatus providing a resistive evaporation hot anode (REHA) arc plasma source within the coating chamber.

In a further embodiment of the invention, illustrated in FIG. 8*h*, the resistive evaporator, having a REHA-crucible with evaporating metal, is placed below the centre of the deflecting magnetic cusp on a side of the cusp opposite to the main chamber containing the substrates to be coated. In this case, part of the plasma stream generated by cathodes 12 is focused toward the crucible, which allows for an increased ionization rate of metal vapor up to 90%.

In a further embodiment of the invention, illustrated in FIG. 8*i*, a resistive evaporator 75 is placed in the centre of a carousel-type substrate holder in the main chamber. In this embodiment the distance between the crucible 70*a* with evaporating metal 71 and the surrounding substrates to be coated can be minimal, which is especially advantageous for evaporating precision metals (Au, Pt, Pd, etc.). The crucible 70*a* can be maintained at floating potential or optionally connected to the positive pole of the auxiliary anode power supply (not shown), which makes it a resistive evaporating hot anode (REHA) device.

In another preferred embodiment, illustrated in FIG. 9, the vacuum pumping system (not shown) is in communication with the interior of the apparatus behind the deflecting electrode 50. In this embodiment a "getter pump" effect is achieved by the constant bombardment of the deflecting electrode 50 with ions such as titanium and zirconium. The deflecting electrode 50 in this embodiment acts as a "vacuum arc plasma trap" which both increases the pumping speed and diverts metal ions from the plasma flow toward the coating chamber 42. This effect can be enhanced by applying a negative or floating potential to a shroud 52 surrounding the deflecting electrode 50, which provides a negative potential in the vicinity of the deflecting electrode that more readily attracts ions and thus increases ion bombardment of the shroud 52, which thus acts as a gettering surface. Preferably the shroud 52 is formed from a stainless steel mesh with large openings (e.g. one to three centimeters), and the surface area of the mesh can be maximized (to maximize ion attraction) by providing conductive ribs or plates extending orthogonally relative to the deflecting electrode plate 50*a*. The deflecting electrode 50 in this embodiment should be regularly removed and cleaned of contaminants and accumulated debris.

This embodiment provides the additional advantage of reducing backstreaming of diffusion pump oil vapours, represented by undulating arrows in FIG. 9, into the apparatus 40. Oil molecules tend to initially adhere to the deflecting electrode 50 and are quickly trapped by a coating of metal film that forms on the deflecting electrode 50 through ion bombardment.

Figure 5A:
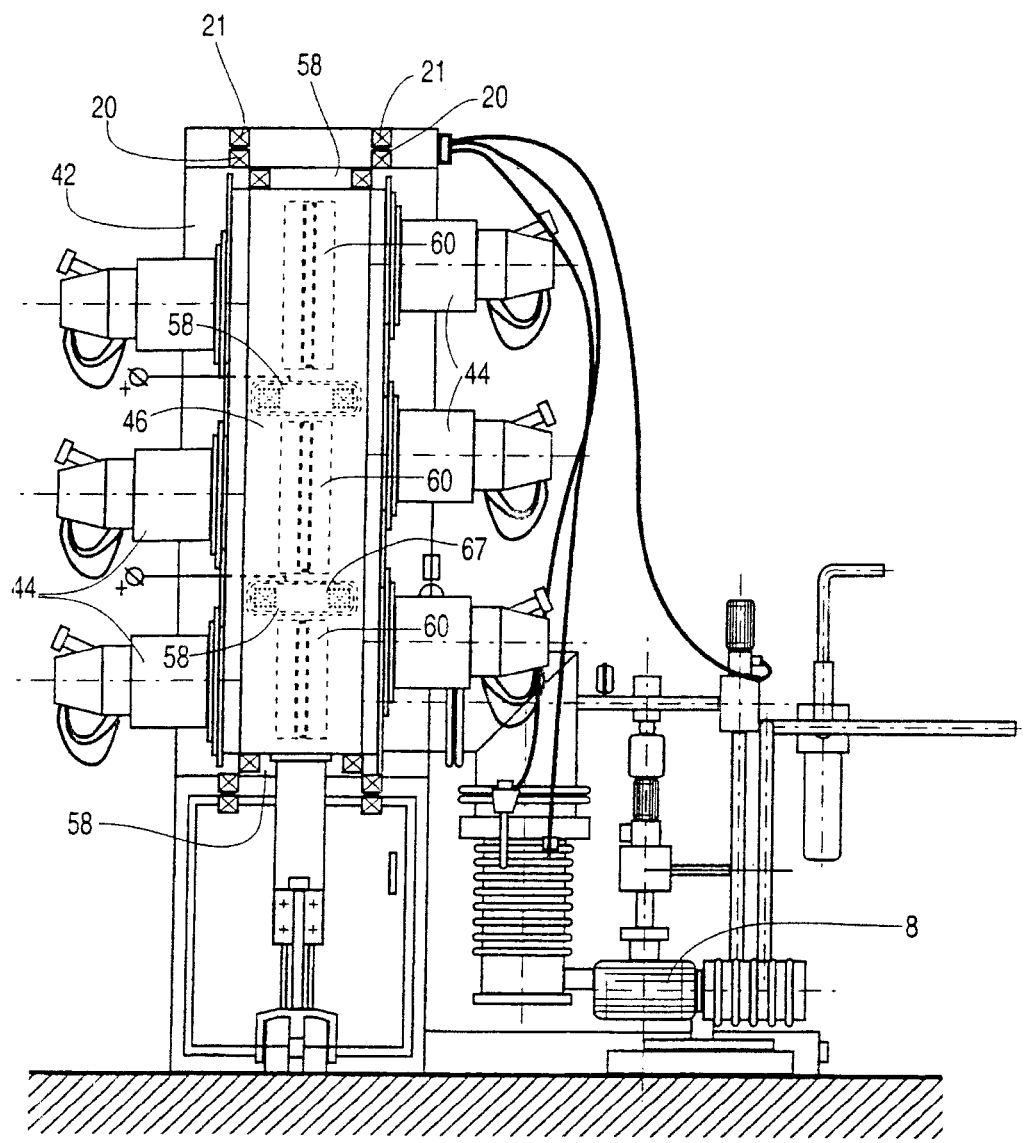
FIG. 5a is a side elevation of the arc coating apparatus of FIG. 4.

FIGS. 4 to 7 illustrate a multiple cathode-pair embodiment of the invention utilizing a conventional vacuum pumping system 8. As best seen in FIG. 5, a plurality of pairs of cathode chambers 44 are disposed in stacked relation on either side of a long vertical plasma duct 46. As shown in FIG. 4, the stack of cathode chamber pairs on each side of the plasma duct 46 is hinged to the apparatus to allow access to the plasma duct and the coating chamber 42.

As noted above, the use of linear deflecting and focusing conductors 20*a*, 21 allows the plasma duct to be of virtually unlimited length. A plurality of positively biased repelling electrodes 60 are disposed axially along the plasma duct 46. The apparatus of FIGS. 4 to 7 operates as described above in relation to the dual cathode embodiment of FIG. 3*b*, driving the plasma flow through a common plasma duct 46 toward a common coating chamber 42.

Figure 12:
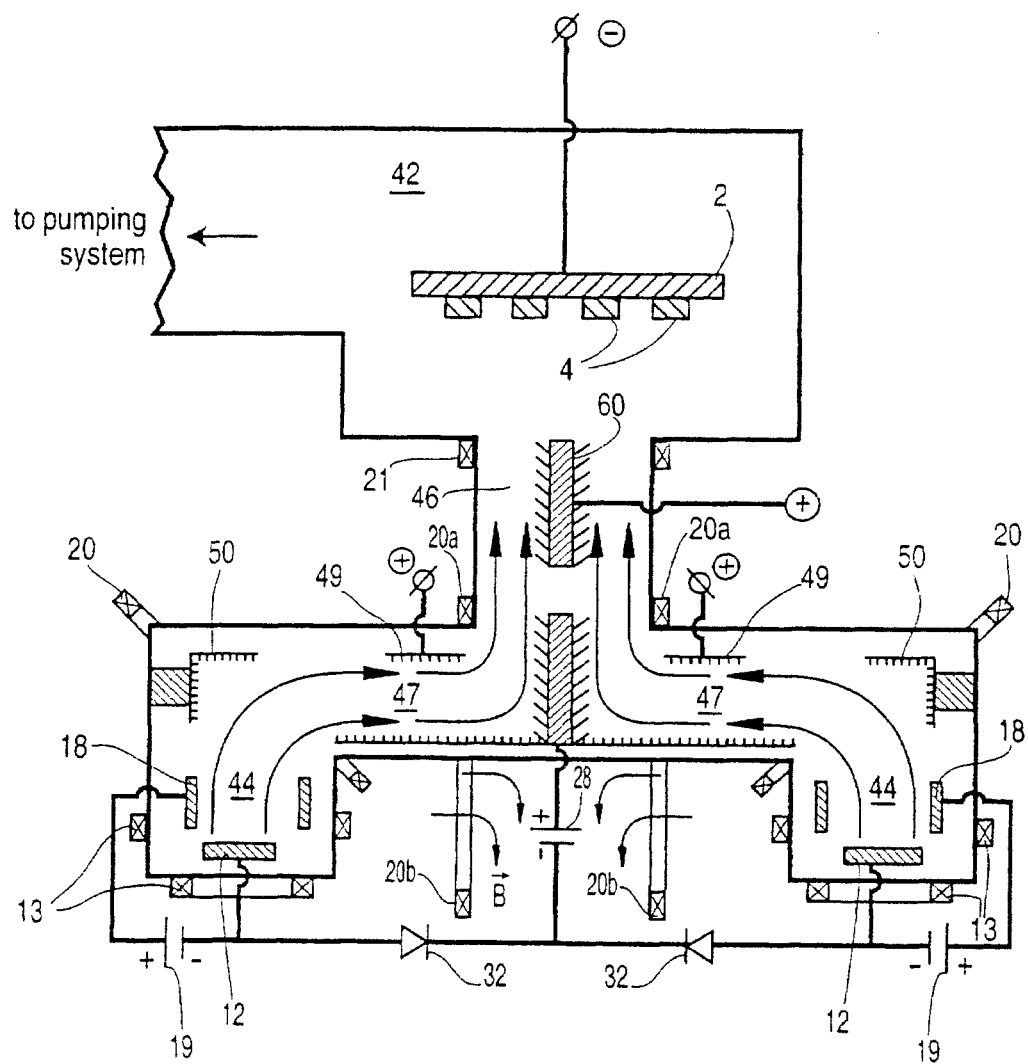
FIG. 12 is a schematic plan view of an embodiment of a vacuum arc coating apparatus utilizing filtered arc sources with an additional filtration stage.

To compensate for the non-uniform plasma density, particularly in the case of a non-rectangular plasma source 12, isolating coils 58 are disposed about the interior of the plasma duct 46. These isolating coils 58 are isolated from the plasma flow, preferably by a water cooling enclosure and shielded by medial auxiliary anodes 67, and divide the plasma duct into magnetically isolated sections or "cells". The isolating coils 58 can be rastered in sequence in opposite directions (boustrophedonically) to render the plasma stream more uniform as it traverses the plasma duct 46. By imposing a vertically scanning magnetic field in alternating directions using the isolating coils 58, the plasma stream is stabilized and dispersed uniformly within the plasma duct 46. FIG. 12 illustrates coating thickness as a function of distance from the top of the apparatus in an alternating vertical scanning embodiment of the invention.

The embodiment of FIGS. 4 to 7 thus permits a common plasma duct 46 to be of virtually unlimited length, since the isolating coils create separate cells within which the plasma is uniformly distributed, and can be rastered to assist in driving the plasma flow through the elongated plasma duct 46 to the coating chamber 42.

The plasma jet is driven through the plasma guide 46 with a helical rotation, the direction of rotation being determined by the direction of the magnetic fields generated by the deflecting coils 20 and focusing coils 21 (and steering and focusing coils of the cathodic arc sources). The helical rotation of the plasma jet causes ions to impact the substrates 4 at an angle, creating an "ion shadow" on the substrates. Periodically changing the direction of all deflecting and focusing magnetic fields in the plasma duct 46 (as well as steering and focusing coils of the cathodic arc sources) similarly changes the direction of helical rotation of the plasma flow, and by allowing ions to bombard the substrates from different angles thus generates a more uniform coating structure, particularly in multi-layer coatings.

Figure 5B:
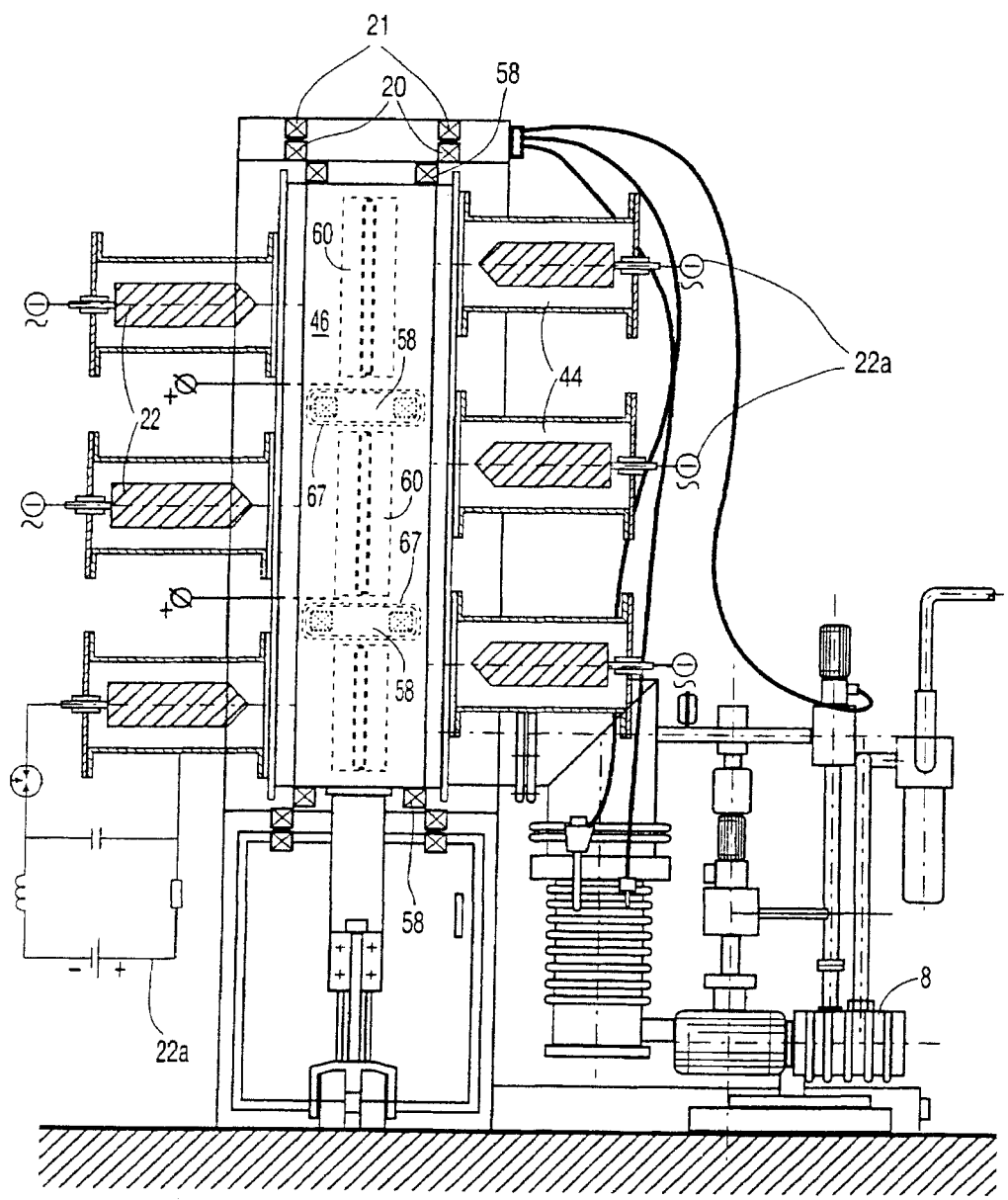
FIG. 5b is a cross-sectional side elevation of a further embodiment of the arc coating apparatus of FIG. 4 having impulse cathodic arc sources.
Figure 6:
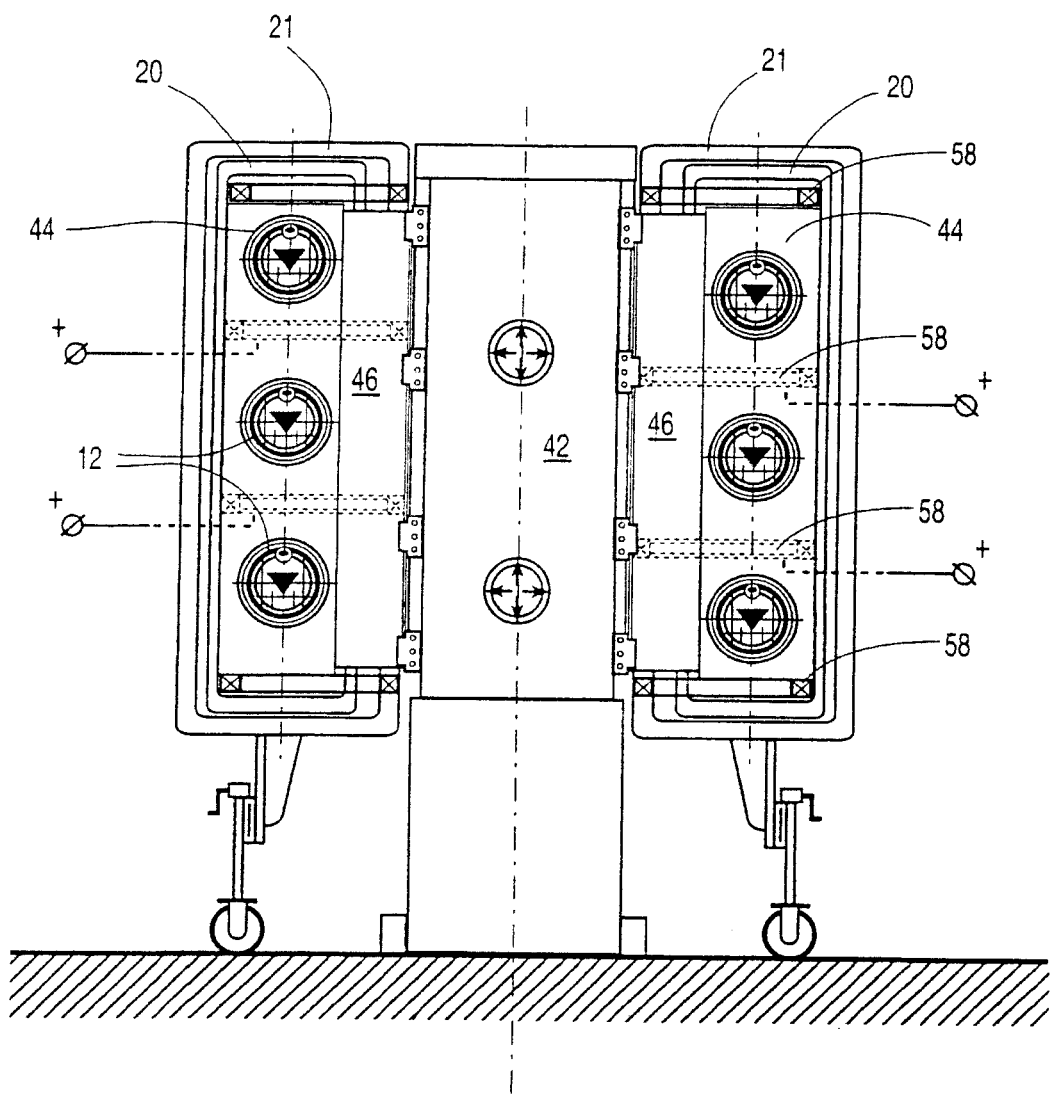
FIG. 6 is a front elevation of the arc coating apparatus of FIG. 4.

FIG. 5b illustrates a variant of this embodiment in which impulse cathodic arc sources 22 are provided, to allowing for rastering or scanning of the cathodic arc sources 22 in conjunction with the isolating coils 58 during the coating process. When the impulse cathodic arc sources 22 are energized, plasma jets are generated in bursts along magnetic field lines created by the deflecting magnetic coils 20 and a rastering system established by scanning the isolating coils 58. These magnetic coils 20, 58 combine to create a magnetic field "wave" which guides the plasma jets toward the coating chamber 42. By rastering the magnetic fields in conjunction with impulsing of the cathodic arc sources 22, each impulse provides a burst of metal plasma to a different location along the substrates 4. In order to ensure a uniform coating, the rastering cycle for the impulse cathodes 22 should be much shorter, for example 10 times shorter, than the scanning cycle for the isolating coils 58.

In all of the described embodiments the filtered arc source can be any kind of plasma source, including hollow cathode plasma sources, and magnetoplasmadynamic accelerators providing a supersonic plasma jet throughout the apparatus. In impulse cathodic arc sources, and any other plasma jet sources, in order for the plasma jet to retain its integrity the directed kinetic energy of the ion component of the plasma must exceed the chaotic average kinetic energy of the electron component of the plasma (i.e. the electron temperature), which can be described as $E_i \gg \kappa^* T_e$ in which $E_i$ is the directed kinetic energy of the ion component in electron volts, $T_e$ is the chaotic average kinetic energy of the electron component, and $\kappa$ is Bolzmann's constant. Otherwise the ion component will tend to diffuse into the plasma rather than flow in a directed plasma stream. Typically the chaotic kinetic energy of the electron component is in the order of 1 to 5 electron volts, while the ion component has a much smaller chaotic kinetic energy. In a filtered arc flow the directed kinetic energy of the ion component of the plasma is typically in the order of 20 to 200 electron volts. Another vapor plasma source having an average kinetic energy of emitted atomic particles (evaporating or sputtering atoms/ions) which does not exceed three times the chaotic average kinetic energy of the electron component of the plasma ($E_{i,a} < 3\kappa^* T_e$) can be installed elsewhere in main chamber 42 or in the plasma duct 46 in a position optically in sight of the substrate holder 2. This source can be a magnetron sputtering plasma source, resistive evaporating plasma source and/or electron beam evaporating plasma source.

FIG. 12 shows an embodiment of the invention utilizing filtered arc sources with an additional filtration stage. In this embodiment the cathodes 12 are disposed in cathode chambers 44 in communication with filtered plasma ducts 47 which are oriented substantially perpendicular to the optical axes of the cathodes 12, and which in turn are oriented substantially perpendicular to the main plasma duct 46. A repelling electrode 60 is provided in the main plasma duct 46, and deflecting electrodes 50 are positioned along the axis of the plasma duct 46 and at the corners of the filtered plasma ducts 47 opposite the cathodes. Additional medial auxiliary anodes 49 may be provided near the junction of the filtered plasma ducts 47 and the main plasma duct 46, to repel plasma from the apparatus walls. Deflecting conductors 20 are disposed, as in the previous embodiments, so that the magnetic cusps generated thereby follow the plasma path from the cathodes 12 to the substrate holder 2. This embodiment, by orienting the main plasma duct 46 off of the axes of the filtered plasma ducts 47, provides the advantage of an additional filtration stage which can be useful in semiconductor and optical applications, where a particularly clean plasma is required.

Following are examples of the treatment of substrates in the embodiments described above:

Example 1

Filtered Arc Plasma Immersed Ion Cleaning

The arc coating apparatus shown in FIG. 3b was used in this process. The apparatus was equipped with two dual-filtered arc sources, having round cathodes 12 measuring 3" in diameter and 2" in height, one filtered arc source having titanium targets and the other having chromium targets. The exit opening of the filtered arc sources was equipped with load lock shutters 80a, 80b, electron-permeable to provide a free passage of electron current from the cathode targets 12 to distal auxiliary anodes 70 to thereby establish an auxiliary arc discharge. Augmented by the auxiliary arc discharge the ionization and activation of the gaseous component of the plasma environment in the coating chamber 42 was significantly increased (up to 30 to 40% in comparison with approximately 1 to 3% gas ionization rate without the auxiliary arc discharge).

2" diameter, ¼" thick HSS disc coupons as substrates 4 were washed in a detergent containing a water solution and dried by isopropyl alcohol and placed in a dry cabinet for 2 hours at 200° C. The substrates 4 were then loaded into the coating chamber 42 and attached to the rotary satellites of the substrate platform 2, for double rotation at a rotational speed of 12 rpm. The vacuum chamber was evacuated to $4 \times 10^{-6}$ Torr and then a gas mixture containing 80% argon, 18% hydrogen and 2% oxygen as an ion cleaning gas, was injected to create a total pressure ranging from $4 \times 10^{-4}$ to $8 \times 10^{-4}$ Torr. Both load lock shutters 80a, 80b were locked and cathodic arc sources 12 were activated in at least one filtered arc source, preferably that with the titanium targets. The deflecting magnetic system was not activated. The auxiliary arc discharge was activated between the cathodes 12 of the filtered arc source and the distal auxiliary anodes 70 installed in the coating chamber 42. The total auxiliary discharge current was established at 80 amps. The RF bias power supply was activated and a self-bias potential was established at 600 volts. The ion cleaning stage was performed for 10 minutes.

Example 2

Ion Nitriding and Ion Implantation in the Auxiliary Arc Discharge

The apparatus and substrate coupons 4 of Example 1 were used in this process. After the ion cleaning stage the gas mixture was changed to nitrogen as an ion nitriding gas, injected to create a total pressure ranging from $2\times10^{-4}$ to $8\times10^{-4}$ Torr. For ion nitriding the substrates 4 were preliminary heated to 300° C. to 450° C. using conventional heaters (not shown) installed in front of the distal auxiliary anodes 70 in the coating chamber 42. A self-bias voltage was established at a range from 100 to 400 volts. The current applied to distal auxiliary anodes 70 was set at 100 amps and the ion nitriding stage was performed for 1 hour.

For low-energy ion implantation the substrate temperature was set to a lower level, about 150 to 300° C., and the bias voltage ranged from 200 to 3000 volts. The ion implantation stage was performed for 1 hour.

The ion nitriding and ion implanted layers were characterized by structure, thickness, microhardness depth profile, and surface roughness. It was found that ion nitriding in this process provided a greater roughness of the substrate surface in comparison to ion implantation, while the rate of nitriding was up to one order of magnitude greater than the rate of ion implantation. The rate of ion nitriding for HSS steel had reached up to 1 µm/hr in comparison with 0.08 to 0.12 µm/hr for low energy ion implantation with the same 600 volt self-bias on the substrates 4.

Example 3

Auxiliary Arc Plasma Immersed Deposition of Chromium Nitride Filtered Arc PVD Coating The apparatus of FIG. 3b was equipped with the same cathode targets 12 as in Example 1. The same substrate coupons 4 as in Example 1 were installed on the rotary satellites of substrate holder 2 with single rotation and preheated to 400° C. by conventional heaters installed in the coating chamber 42. After ion cleaning as described in Example 1 the lock load shutter 80b of the filtered arc source with the chromium cathode targets 12 was opened and the gas was changed to pure nitrogen with total pressure of $2\times10^{-4}$ to $3\times10^{-4}$ Torr. The deflecting and focusing magnetic coils 13, 20 of the filtered arc source magnetic systems were activated to deflect the chromium plasma stream toward substrates. The total current of the deflecting anode 50 was established at 50 amps, and the total current of the repelling anode was established at 40 amps. The current between chromium cathodes 12 and distal auxiliary anodes 70 was established at 30 amps.

The load lock shutters 80a corresponding to the other filtered arc source, with the titanium cathode targets 12, remained locked and the corresponding deflecting coils 20 and deflecting anode 50 were inactive while both cathodic arc sources with titanium targets 12 were activated. Without the deflecting em fields the plasma stream remained substantially confined to the cathode chamber 44, and the titanium cathode targets served as electron emitters, providing additional current to the distal auxiliary anodes 70 up to 80 amps. Coating deposition was performed for 3 hours. The nanohardness of the CrN coatings was measured at a level of 22 to 25 GPa, in comparison to the microhardness of regular CrN coatings prepared by direct vacuum arc deposition process, which does not exceed 20 GPa.

Example 4

Large Area TiN Filtered Arc Coatings

The apparatus of FIG. 3b was equipped with the same cathode targets 12 as in Example 1. In this example the substrate coupons 4 were made from stainless steel as bars with a 1" width, ½" thickness and 14" length. The substrates 4 were installed on the rotary satellite positions of substrate platform 2, with double rotation. The substrates 4 were preheated to 400° C. before the deposition stage commenced.

After ion cleaning the substrates 4 as described in Example 1, a TiN coating was deposited from the filtered arc source having titanium cathode targets 12, while the other filtered arc source with chromium cathode targets 12 was inactive. The current applied to the deflecting anode 50 was established at 60 amps, the current applied to the repelling anode 60 was established at 30 amps, and the current between the titanium cathodes 12 and the distal auxiliary anodes 70 was established at 30 amps to support an auxiliary arc-assisted filtered arc deposition process.

In the first trial the vertical magnetic field created by scanning isolating coils 58 (shown in FIGS. 5 to 7) was directed upward. In the second trial the vertical magnetic field created by scanning isolating coils 58 was directed downward. In the third trial the isolating coils 58 were activated in a periodically repeatable pulse mode with the magnetic field vector directed upward for 0.55 min and, in turn, the magnetic field vector directed downward for 0.45 min. Scanning the isolating coils 58 in this fashion allowed up to a 90% uniformity of coating thickness over the large area coating zone (14" in this example). By way of contrast, in a conventional direct cathodic arc deposition process it is not possible to scan the plasma flow with electromagnetic fields due to the neutral phase (atoms, clusters and macroparticles) which constitute up to 60% of the total erosion mass of the vacuum arc jet.

Example 5

Auxiliary Arc Plasma Immersed CVD Coatings

In this trial indexable carbide inserts, installed on the rotary satellites of the substrate platform 2 with single rotation, were used as substrate coupons 4. The process parameters were established as in Example 2, but in this case the gas mixture was provided as nitrogen+methane+titanium tetrachloride ($TiCl_4$) with total pressure of about $5\times10^{-4}$ Torr. A bi-polar impulse bias voltage with an impulse frequency of 250 kHz and a negative voltage of up to 600 volts was applied to the substrates 4 during this process. The highly activated gaseous plasma environment resulted in a deposition rate for the TiCN coating of up to 3 µm/hr in this low pressure plasma immersed CVD process.

Example 6

Impulse Filtered Arc Deposition of Diamond-Like Coatings (DLC)

In this example the apparatus of FIG. 5b was equipped with impulse cathodic arc sources 12 having cylindrical targets made from pyrolitical graphite. Indexable carbide inserts as substrate coupons 4 were installed on the satellites of substrate platform 2 with single rotation at a rotational speed of 12 r.p.m. The apparatus was evacuated to $5\times10^{-6}$ Torr and DC bias voltage from DC bias power supply 29b was set to 1000 volts. The deflecting coils 13 and focusing coils 20 of the filtered arc sources were activated. Deflecting anode 50 was connected to the positive pole of DC power supply 29a while a negative pole was grounded. The repelling anode 60 was connected to another DC power supply 26a in the same manner.

The isolating coils 58 were activated to provide vertical scanning with a periodic change in the direction of the vertical magnetic field vector from up to down, with a repetition frequency of 0.5 Hz. All impulse cathodic arc sources 12 were activated with a pulse discharge repetition frequency of 10 Hz. During the first minute of the process, the bias voltage of the substrates 4 was established at to 1000 volts to provide a sublayer between the carbide substrate surface and DLC film, while during deposition the substrate bias was reduced to 100 volts. The rate of deposition of DLC over a 12" high and 20" diameter coating zone reached 1 μm/hr. The nanohardness of DLC created in this process reached up to 65 Gpa.

Example 7

Impulse Filtered Arc Implantation of Titanium in H13 Steel

In this example the apparatus of Example 6 was used. The impulse cathodic arc sources 12 were equipped with titanium targets as central electrodes. All other parameters of the process were set up as in Example 6, but the DC bias on the substrates 4 was established at 3000 volts. In this case the duration of the coating process was 2 hours, resulting in titanium implantation of the H13 steel coupons with depth about 1 μm.

Example 8

Large Area Plasma Immersed Hybrid Filtered Arc/Magnetron TiCrN/CrN Multi-Layer Coatings In this example substrate coupons 4 were ½"×½" indexable carbide (WC-6% Co) inserts, installed on the satellite positions of the substrate platform 2 with double rotation and vertically distributed evenly over a 14" vertical deposition zone. The coating chamber 4 layout used for this experiment is shown schematically in FIG. 8c. Two titanium cathode targets 12 were installed on the dual-arc filtered arc source, while both magnetron sources 90 were provided with chromium targets. The substrates 4 were preheated to 400° C. before the deposition stage commenced.

After ion cleaning as in Example 1, the deflecting magnetic system 13 of the filtered arc source was activated and a Ti coating was deposited from the dual arc filtered arc source for a duration of 3 minutes. Pure argon as a plasma-creating gas was injected in the vicinity of the magnetron targets 90 to a total operating pressure $2 \times 10^{-4}$ to $4 \times 10^{-4}$ Torr. The substrate bias voltage during deposition of the Ti sublayer was held at 600 V, providing extensive ion bombardment of the substrates 4 before the deposition of the main layers. The total current of the auxiliary arc discharge (between the titanium cathodes 12 of the filtered arc source and the distal auxiliary anodes 70 surrounding the magnetron cathodes 90) was set at 100 amps.

After 3 minutes of Ti coating deposition nitrogen was added to gas mixture, to provide a reactive gaseous component of gas-metal plasma for the deposition of TiCrN coatings. Both magnetrons 90 were activated with the magnetron cathode 90 voltage set at 650 volts. The current applied to the deflecting anode 50 was established at 60 amps, and the current applied to the repelling anode 60 was established at 30 amps. When the deflecting magnetic field of the filtered arc source was activated, a TiCrN layer was deposited on the substrates 4 for a duration of 10 minutes. This was followed by a CrN layer deposition stage lasting 30 minutes, during which the deflecting magnetic field of the filtered arc source was deactivated, but the auxiliary arc discharge remained established between the arc cathodes 12 of the filtered arc source and the auxiliary anodes 70, providing a greater ionization rate for the gaseous plasma component. The result was both higher productivity of magnetron sputtering and a fine CrN coating structure.

Example 9

Large Area Filtered Arc Plasma Immersion Ion Vapor Deposition of Corrosion Resistant Platinum Coating for Fuel Cell Plates In this example substrate proton exchange membrane fuel cell (PEMFC) endplates 6" in diameter made of aluminum with a 75 μm phosphorous-nickel electroplating coating, were installed on the satellite positions of the substrate platform 2 with double rotation and horizontally distributed evenly over a 14" long deposition zone. The coating chamber 4 layout used for this experiment is shown schematically in FIG. 8d. Two titanium cathode targets 12 were installed on the dual-arc filtered arc source, while a crucible 70a in a form of DC heated tungsten foil boat was provided with 150 mg of 99.95% pure platinum. The substrates endplates were preheated to 300 degrees C. before the deposition stage commenced.

After ion cleaning as in Example 1, the deflecting magnetic system 13 of the filtered arc source was activated and a Ti coating was deposited from the dual arc filtered arc source for a duration of 1 hour. Pure argon as a plasma-creating gas was injected into the main chamber 42 to a total operating pressure of $2 \times 10^{-4}$ to $4 \times 10^{-4}$ Torr. The substrate bias voltage during deposition of the Ti interlayer was held at −60 V, providing extensive ion bombardment of the substrates before the deposition of the main layers. The total current of the auxiliary arc discharge (between the titanium cathodes 12 of the filtered arc source and the distal auxiliary anode 70) was set at 100 amps.

After 1 hour of Ti coating deposition the tungsten boat was heated by DC resistant heating to 1800 degrees C. for evaporating platinum. The deflecting magnetic system was deactivated and platinum coating was deposited over an interval of 2 hours. The result was a highly adhesive platinum corrosive resistant coating having 20 nm thickness, providing stable operation of the endplates in a highly corrosive PEMFC environment. The distribution of electrical resistivity over the surface of the endplates was measured by a 4-points probe, showing a uniformity of surface electrical resistance at +/−5% over the surface of PEMFC endplates. This distribution was not changed after exposing the endplates to a PEMFC water environment over 350 hrs.

Example 10

Large Area Filtered Arc Plasma Immersion Ion Vapor Deposition of Corrosion Resistant Platinum Coating Having Me/MeN Buffer Multilayer Intermediate Coating for Fuel Cell Plates In this example substrate proton exchange membrane fuel cell (PEMFC) endplates 6" in diameter were made of aluminum by a stamping process followed by 75 μm phosphorus nickel electroplating coatings. The plates to be coated were installed on the satellite positions of the substrate platform 2 with double rotation and horizontally distributed evenly over a 14" long deposition zone. The coating chamber 4 layout used for this experiment is shown schematically in FIG. 8i. Different pairs of cathode targets 12 were installed on the opposite primary cathodic arc sources of the dual-arc filtered arc source, as is shown in Table 1, while the crucible 70a in a form of DC heated tungsten foil boat was provided with 150 mg of 99.95% pure platinum. The substrate endplates were preheated to 300 degrees C. before the deposition stage commenced.

TABLE 1

Type of cathode targets for multilayer cermet coatings

| Item # | Left Target | Right Target | Multilayer Coating |
|---|---|---|---|
| 1 | Ti | Ti | Ti/TiN |
| 2 | Ti | Cr | TiCr/TiCrN |
| 3 | Cr | Cr | Cr/CrN |
| 4 | Zr | Zr | Zr/ZrN |
| 5 | Ti | Zr | TiZr/TiZrN |

After ion cleaning as in Example 1, the deflecting magnetic system 13 of the filtered arc source was activated and a TiN/ZrN superlattice coating was deposited from the dual arc filtered arc source for a duration of 3 hrs to achieve coating thickness of about 3 μm. Pure nitrogen as a plasma-creating gas was injected into the main chamber 42 to a total operating pressure of $2 \times 10^{-4}$ to $4 \times 10^{-4}$ Ton. The substrate bias voltage during deposition of the TiN/ZrN interlayer was held at −40 V, providing extensive ion bombardment of the substrates before the deposition of the main layers. The total current of the auxiliary arc discharge between the titanium and zirconium cathodes 12 of the filtered arc source and the distal auxiliary anodes 70 and REHA-crucible 70a was set at 100 amps.

After 3 hours of TiN/ZrN coating deposition the tungsten boat was heated by DC resistant heating to 1800 degrees C. for evaporating platinum. Deflecting magnetic system was deactivated and a platinum coating was deposited over an interval of 2 hrs. The result was a highly adhesive platinum corrosive resistant coating having a 25 nm thickness over superlattice TiN/ZrN 3 μm coating, providing stable operation of the endplates in highly corrosive PEMFC environment. The distribution of electrical resistivity over the surface of endplates was measured by 4-points probe, showing a uniformity of the surface electrical resistance of +/−5% over the surface of the PEMFC endplates. This distribution was not changed after exposing the endplates to a PEMFC water environment over 350 hrs.

Example 11

Large Area Filtered Arc Plasma Immersion Ion Vapor Deposition of Corrosion Resistant Platinum Coating with TiN/ZrN Superlattice Buffer Interlayer for Fuel Cell Plates In this example substrate proton exchange membrane fuel cell (PEMFC) endplates 6" in diameter were made of aluminum by a stamping process followed by 70 μm phosphorus nickel electroplating coatings. The plates to be coated were installed on the satellite positions of the substrate platform 2 with double rotation and horizontally distributed evenly over a 14" long deposition zone. The coating chamber 4 layout used for this experiment is shown schematically in FIG. 8i. One zirconium and one titanium cathode target 12 was installed opposite the primary cathodic arc sources of the dual-arc filtered arc source, while the crucible 70a in a form of DC heated tungsten foil boat was provided with 150 mg of 99.95% pure platinum. The substrate endplates were preheated to 300 degrees C. before the deposition stage commenced.

After ion cleaning as in Example 1, the deflecting magnetic system 13 of the filtered arc source was activated and a TiN/ZrN superlattice coating was deposited from the dual arc filtered arc source for a duration of 3 hours to achieve a coating thickness of about 3 μm. Pure nitrogen as a plasma-creating gas was injected into the main chamber 42 to a total operating pressure of $2 \times 10^{-4}$ to $4 \times 10^{-4}$ Torr. The substrate bias voltage during deposition of the TiN/ZrN interlayer was held at −40 V, providing extensive ion bombardment of the substrates before the deposition of the main layers. The total current of the auxiliary arc discharge between the titanium and zirconium cathodes 12 of the filtered arc source and the distal auxiliary anodes 70 and REHA-crucible 70a was set at 100 amps.

After 3 hrs of TiN/ZrN coating deposition the tungsten boat was heated by DC resistant heating to 1800 degrees C. for evaporating platinum. Deflecting magnetic system was deactivated and a platinum coating was deposited over an interval of 2 hours. The result was highly adhesive platinum corrosive resistant coating having 20 nm thickness over a superlattice TiN/ZrN 3 μm coating, providing stable operation of the endplates in highly corrosive PEMFC environment. The distribution of electrical resistivity over the surface of endplates was measured by a 4-points probe, showing uniformity of the surface electrical resistance at +/−5% over the surface of PEMFC endplates. This distribution was not changed after exposing the endplates to a PEMFC water environment over 350 hrs.

Example 12

Large Area Filtered Arc Plasma Immersion Ion Vapor Deposition of Corrosion Resistant Palladium Coating for Fuel Cell Plates In this example substrate PEMFC endplates 6" in diameter made of titanium, were installed on the satellite positions of the substrate platform 2 with double rotation and horizontally distributed evenly over a 14" long deposition zone. The coating chamber 4 layout used for this experiment is shown schematically in FIG. 8e. Two titanium cathode targets 12 were installed on the dual-arc filtered arc source, while the crucible 70a in a form of an indirect resistance heated alumina crucible was provided with 300 mg of 99.95% pure palladium. The substrate endplates were preheated to 300 degrees C. before the deposition stage commenced.

After ion cleaning as in Example 1, the deflecting magnetic system 13 of the filtered arc source was activated and a Ti coating was deposited from the dual arc filtered arc source for a duration of 1 hour. Pure argon as a plasma-creating gas was injected in the main chamber 42 to a total operating pressure of $2 \times 10^{-4}$ to $4 \times 10^{-4}$ Torr. The substrate bias voltage during deposition of the Ti interlayer was held at −40 V, providing extensive ion bombardment of the substrates before the deposition of the main layers. The total current of the auxiliary arc discharge (between the titanium cathodes 12 of the filtered arc source and the distal auxiliary anode 70) was set at 100 amps.

After 1 hr of Ti coating deposition the crucible was heated by DC resistant heating to 1600 degrees C. for evaporating palladium. The deflecting magnetic system was deactivated and a platinum coating was deposited over an interval of 1 hour. The result was highly adhesive palladium corrosive resistant coating having 60 nm thickness, providing stable operation of the endplates in a highly corrosive proton exchange membrane fuel cell environment. The distribution of electrical resistivity over the surface of the endplates was measured by 4-points probe, showing a uniformity of the surface electrical resistance at +/−2% over the surface of the PEMFC endplates. This distribution was not changed after exposing the endplates to a PEMFC water environment over 350 hours.

Example 13

Large Area Filtered Arc Plasma Immersion Ion Vapor Deposition of Corrosion Resistant Coating for Fasteners In this example sample the substrates were fasteners such as nuts and washers made of austenitic stainless steel. The coating chamber 4 layout used for this experiment is shown schematically in FIG. 8h. The substrates were installed on the satellite positions of the substrate platform 2 with double rotation and horizontally distributed evenly over a 14" long deposition zone. Two molybdenum cathode targets 12 were installed on the dual-arc filtered arc source, while the crucible 70a in a form of a resistance heated graphite crucible was provided with 100 g of 99.9% aluminum. The substrates fasteners were preheated to 300 degrees C. before the deposition stage commenced.

After ion cleaning as in Example 1, the deflecting magnetic system 13 of the filtered arc source was activated and an Mo interlayer coating was deposited from the dual arc filtered arc source for a duration of 10 minutes. Pure argon as a plasma-creating gas was injected into the main chamber 42 to a total operating pressure of $2\times10^{-4}$ to $4\times10^{-4}$ Torr. The substrate bias voltage during deposition of the Mo interlayer was held at −200 V, providing extensive ion bombardment of the substrates before the deposition of the main layer. The total current of the auxiliary arc discharge (between the Mo cathodes 12 of the filtered arc source and the distal auxiliary anode 70) was set at 100 amps.

After 10 minutes of Mo coating deposition the graphite crucible was heated by DC resistant heating to 1100 degrees C. for evaporating aluminium. Deflecting magnetic system was activated providing simultaneously Mo filtered cathodic arc plasma flow and aluminium anodic arc vapor plasma stream toward the substrates to be coated. The Al/Mo coating was deposited over an interval of 3 hours. The result was a highly adhesive aluminium coating alloyed with molybdenum having 20 μm thickness. Corrosion resistance test provided in neutral salt spray demonstrated no sign of corrosion over 350 hours.

Example 14

Large Area Filtered Arc Plasma Immersion E-Beam Deposition of Cubic Boron Nitride Coatings In this example sample substrates were indexable carbide inserts of the same size as in Example 8. The coating chamber 4 layout used for this experiment is shown schematically in FIG. 8h. The substrates were installed on the substrate platform 2 and horizontally distributed evenly over a 14" long deposition zone. Two cathode targets 12 made of boron carbide ($B_4C$) were installed on the dual-arc filtered arc source, while the crucible of the electron-beam evaporator was provided with 50 g of 99.95% pure boron powder. The substrate inserts were preheated to 300 degrees C. before the deposition stage commenced.

After ion cleaning as in Example 1, the deflecting magnetic system 13 of the filtered arc source was activated and a boron carbide interlayer coating was deposited from the dual arc filtered arc source for a duration of 20 minutes. Pure argon as a plasma-creating gas was injected into the main chamber 42 to a total operating pressure ranging from $2\times10^{-4}$ to $4\times10^{-4}$ Ton. The substrate bias voltage during deposition of the boron carbide interlayer was held at −40 V, providing extensive ion bombardment of the substrates before the deposition of the main layer. The total current of the auxiliary arc discharge (between the boron carbide cathodes 12 of the filtered arc source and the distal auxiliary anode 70) was set at 120 amps.

After 10 minutes of boron carbide coating deposition the argon was replaced by nitrogen as reactive gas to deposit the following boron carbo-nitride BCN interlayer coating over 20 minutes. After this stage the electron-beam gun was activated to start boron evaporation. The boron vapor plasma stream was merged with the boron-carbon filtered arc plasma stream for deposition BCN coating with excess boron concentration over 10 minutes. After this stage the deflecting magnetic system of the filtered arc source was deactivated and a boron nitride coating was deposited during an interval of 30 minutes from boron vapor plasma created by the electron beam evaporation of boron in a highly ionized auxiliary arc plasma created between the cathodes of the filtered arc source and distal anode 70. The result was highly adhesive boron nitride coating consisting of more than 80% of a cubic BN phase, as measured by IR absorption spectroscopy.

Preferred embodiments of the invention having been thus described by way of example, various modifications and adaptations will be apparent to those skilled in the art. The invention is intended to include all such modifications and adaptations as fall within the scope of the appended claims.

I claim:

1. An apparatus for the application of coatings in a vacuum, comprising:
    at least one plasma source comprising a cathode contained within a cathode chamber,
    at least one proximal anode associated with the cathode for generating an arc discharge,
    a plasma duct in communication with the cathode chamber and with a coating chamber containing a substrate holder for mounting substrates to be coated, the substrate holder being positioned off of an optical axis of the cathode,
    a deflecting conductor positioned adjacent to the plasma duct for generating a deflecting magnetic field for deflecting plasma from the optical axis of the cathode toward the coating chamber,
    a focusing conductor positioned adjacent to the plasma duct for generating a focusing magnetic field for focusing plasma entering the coating chamber, and
    at least one deflecting electrode disposed downstream of the plasma source and positioned within the plasma duct, in alignment with a plane of symmetry between opposite walls of the plasma duct and generally parallel to a direction of plasma flow through the plasma duct, for deflecting plasma toward the coating chamber.

2. The apparatus of claim 1, wherein the deflecting electrode is disposed generally parallel to a direction of plasma flow in the plasma duct.

3. The apparatus of claim 2, wherein the deflecting electrode is disposed near a position where a tangential component of the magnetic fields is strongest.

4. The apparatus of claim 3, wherein the deflecting electrode comprises a generally planar conductive plate.

5. The apparatus of claim 4, wherein the deflecting electrode comprises a plurality of baffles.

6. The apparatus of claim 3, wherein the deflecting electrode comprises a portion substantially parallel to the optical axis of the cathode.

7. The apparatus of claim 1, comprising a plurality of cathode chambers disposed on opposed sides of the plasma duct.

* * * * *